(12) United States Patent
Son et al.

(10) Patent No.: US 12,431,383 B2
(45) Date of Patent: Sep. 30, 2025

(54) SUBSTRATE TREATING APPARATUS AND SUBSTRATE TREATING METHOD

(71) Applicant: SEMES CO., LTD., Chungcheongnam-do (KR)

(72) Inventors: Won Sik Son, Gyeonggi-do (KR); Se Hoon Oh, Chungcheongnam-do (KR); In Ki Jung, Gyeonggi-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 420 days.

(21) Appl. No.: 17/965,058

(22) Filed: Oct. 13, 2022

(65) Prior Publication Data

US 2023/0119960 A1    Apr. 20, 2023

(30) Foreign Application Priority Data

Oct. 14, 2021  (KR) ................ 10-2021-0136382

(51) Int. Cl.
*H01L 21/687* (2006.01)
*B08B 3/04* (2006.01)
*H01L 21/67* (2006.01)

(52) U.S. Cl.
CPC ........ *H01L 21/68785* (2013.01); *B08B 3/041* (2013.01); *H01L 21/67023* (2013.01)

(58) Field of Classification Search
None
See application file for complete search history.

(56) References Cited

U.S. PATENT DOCUMENTS

| | | |
|---|---|---|
| 2006/0113039 A1 | 6/2006 | Shimbara et al. |
| 2017/0250097 A1 | 8/2017 | Hamada et al. |

(Continued)

FOREIGN PATENT DOCUMENTS

| | | |
|---|---|---|
| CN | 103165495 A | 6/2013 |
| JP | 2002-057205 A | 2/2002 |
| JP | 2004-111902 A | 4/2004 |

(Continued)

OTHER PUBLICATIONS

JP 2017045803 machine translation, Wafer Processing method and wafer processing device, Nakamura (Year: 2017).*

(Continued)

*Primary Examiner* — Cristi J Tate-Sims
(74) *Attorney, Agent, or Firm* — Carter, DeLuca & Farrell LLP

(57) ABSTRACT

Provided is an apparatus for treating a substrate including: a processing vessel having a processing space; a support unit for supporting the substrate in the processing space and rotating the substrate; a liquid supply unit for supplying a processing liquid to the substrate; and a heating unit for heating the substrate, wherein the support unit includes: a spin chuck; a rotation driver for rotating the spin chuck; a chuck pin installed on the spin chuck to be rotated together with the spin chuck; a chuck pin moving unit for moving the chuck pin between a contact position wherein the chuck pin is in contact with a side portion of the substrate and an open position at which the chuck pin is spaced apart from the side portion of the substrate, and the chuck pin moving unit moves the chuck pin while the substrate is being rotated by the spin chuck.

19 Claims, 14 Drawing Sheets

(56) References Cited

U.S. PATENT DOCUMENTS

2017/0282210 A1* 10/2017 Okutani ............ H01L 21/68728
2019/0198363 A1*  6/2019 Shimai ............. H01L 21/67109

FOREIGN PATENT DOCUMENTS

| | | |
|---|---|---|
| JP | 2008-034533 A | 2/2008 |
| JP | 2010-203558 A | 9/2010 |
| JP | 2014-157936 A | 8/2014 |
| JP | 2017-152686 A | 8/2017 |
| JP | 2018-050014 A | 3/2018 |
| JP | 2019-046985 A | 3/2019 |
| JP | 2020-047719 A | 3/2020 |
| JP | 2021-106237 A | 7/2021 |
| KR | 10-1145775 B1 | 5/2012 |
| KR | 10-1445775 B1 | 10/2014 |
| KR | 10-2248770 B1 | 5/2021 |
| TW | 202105572 A | 2/2021 |
| TW | 202125688 A | 7/2021 |

OTHER PUBLICATIONS

Taiwan Office Action issued in corresponding TW Patent Application No. 111138633, dated Aug. 18, 2023, pp. 1-5.
Notice of Reasons for Refusal issued by the Japanese Patent Office on Nov. 28, 2023 in corresponding JP Patent Application No. 2022-163159.

* cited by examiner

SUBSTRATE TREATING APPARATUS AND SUBSTRATE TREATING METHOD

CROSS-REFERENCE TO RELATED APPLICATIONS

This application claims priority to and the benefit of Korean Patent Application No. 10-2021-0136382 filed in the Korean Intellectual Property Office on Oct. 14, 2021, the entire contents of which are incorporated herein by reference.

TECHNICAL FIELD

The present invention relates to a substrate treating apparatus and a substrate treating method.

BACKGROUND ART

In order to manufacture a semiconductor device or a liquid crystal display, various processes, such as photography, ashing, ion implantation, thin film deposition, and cleaning, performed on a substrate. Among them, the etching process or the cleaning process is a process of removing unnecessary regions of a thin film formed on a substrate, or etching or cleaning foreign substances, particles, and the like, and requires high selectivity, high etch rate, and etch uniformity for the thin film, and as semiconductor devices are highly integrated, higher levels of etch selectivity and etch uniformity are required.

In general, in the etching process or cleaning process of the substrate, a processing liquid treatment operation, a rinse treatment operation, and a drying treatment operation are sequentially performed. In one example, in the processing liquid treatment operation, a processing liquid for etching the thin film formed on the substrate or removing foreign substances on the substrate is supplied to the substrate to form a puddle, and then the puddle of the processing liquid is heated to promote the etching by the processing liquid, and in the rinse treatment operation, a rinse liquid, such as pure water, is supplied onto the substrate.

The above-described processing liquid treatment operation is performed by placing the substrate on a support unit and supplying the processing liquid onto the substrate while rotating the support unit. The support unit is provided with chuck pins for supporting the side portion of the substrate to prevent the substrate from moving in the lateral direction of the support unit during rotation. The chuck pins move between a standby position that provides space for a substrate to be placed when the substrate is loaded or unloaded onto the support unit, and a support position that comes into contact with the side portion of the substrate as the process is performed while the substrate placed on the support unit is rotated. Accordingly, the space provided between the chuck pins placed in the standby position is wider than the space provided between the chuck pins placed in the support position.

In general, when the puddle is formed on the substrate, a problem occurs in that the processing liquid flows down along the chuck pin due to the contact between the substrate and the chuck pin. In addition, there is a problem in that it is difficult to maintain a certain amount of liquid film due to the phenomenon in which the processing liquid flows down along the chuck pin.

SUMMARY OF THE INVENTION

The present invention has been made in an effort to provide a substrate treating apparatus and a substrate treating method capable of efficiently treating a substrate.

The present invention has also been made in an effort to provide a support unit in which a chuck pin freely moves during a process by rotating a substrate, and a substrate treating apparatus and method using the same.

The object of the present invention is not limited thereto, and other objects not mentioned will be clearly understood by those of ordinary skill in the art from the following description.

An exemplary embodiment of the present invention provides an apparatus for treating a substrate, the apparatus including: a processing vessel having a processing space; a support unit for supporting the substrate in the processing space and rotating the substrate; a liquid supply unit for supplying a processing liquid to the substrate supported by the support unit; and a heating unit for heating the substrate, in which the support unit includes: a spin chuck; a rotation driver for rotating the spin chuck; a chuck pin installed on the spin chuck so as to be rotated together with the spin chuck; and a chuck pin moving unit for moving the chuck pin between a contact position at which the chuck pin is in contact with a side portion of the substrate and an open position at which the chuck pin is spaced apart from the side portion of the substrate, and the chuck pin moving unit moves the chuck pin while the substrate is being rotated by the spin chuck.

The chuck pin moving unit may include: a first clutch module including a first clutch provided to be movable in a vertical direction by a lifting driver; and a second clutch module including a second clutch facing the first clutch and coupled to the chuck pin.

When the first clutch is in contact with the second clutch, the chuck pin may be moved from the contact position to the open position.

When the first clutch is spaced apart from the second clutch, the chuck pin may be located at the contact position.

The second clutch module may be rotated together with the spin chuck.

When the first clutch comes into contact with the second clutch, the first clutch may be rotated together with the second clutch.

The first clutch module may include: the first clutch; a fixing member which is not rotated together with the spin chuck; and a bearing member disposed between the first clutch and the fixing member.

The bearing member may include an outer ring coupled to the fixing member, an inner ring coupled to the first clutch, and a ball disposed between the outer ring and the inner ring, and when the first clutch is in contact with the second clutch, the first clutch may be rotated together with the second clutch with respect to the fixing member.

An elastic member may be provided between the lifting driver and the first clutch.

An impact mitigating member may be disposed inside the first clutch, and the impact mitigating member may mitigate an impact generated in a rotational direction of the first clutch when the first clutch is in contact with the second clutch and is rotated together with the second clutch.

The second clutch module may include: the second clutch; a base member including a first portion having a longitudinal direction corresponding to the vertical direction, and a second portion extending from the first portion and extending in a direction perpendicular to the longitudinal direction of the first portion; a first moving member movably coupled to the first portion of the base member; a second moving member coupled to the chuck pin and movably coupled to the second portion of the base member; and a third moving member having one end hinged to the first moving member and the other end hinged to the second moving member, and the second clutch is coupled to the first moving member.

The second clutch may include: a plate portion facing the first clutch; and a pillar portion for connecting the plate and the first moving member.

A partition wall may be disposed between the first clutch module and the second clutch module, and the second clutch may be located between the partition wall and the first clutch.

A hole through which the pillar portion of the second clutch passes may be formed in the partition wall, and a sealing member may be provided between an inner surface of the hole of the partition wall and the pillar portion of the second clutch.

The spin chuck may be rotated such that the substrate is rotated at a first speed or a second speed faster than the first speed, when the substrate is rotated at the first speed, the first clutch may be in contact with the second clutch, and when the substrate is rotated at the second speed, the first clutch may be spaced apart from the second clutch.

Another exemplary embodiment of the present invention provides a method of treating a substrate, the method including: a first liquid supply operation of supplying a first liquid to a substrate rotating at a first speed in an open state in which a chuck pin provided for supporting a side portion of the substrate is located at an open position at which the chuck pin is spaced apart from the side portion of the substrate and forming a first liquid film on the substrate; a liquid film heating operation of heating the first liquid film formed on the substrate in the open state, after the first liquid supply operation; and a second liquid supply operation of supplying a second liquid to the substrate rotating at a second speed faster than the first speed in a contact state in which the chuck pin is located at a contact position at which the chuck pin is in contact with the side portion of the substrate to support the side portion of the substrate, after the liquid film heating operation, in which the change from the open state to the contact state is performed while the substrate is being rotated.

The first liquid and the second liquid may be the same, and the first liquid may be an aqueous solution of phosphoric acid.

The amount of second liquid supplied per unit time in the second liquid supply operation may be greater than the amount of first liquid supplied per unit time in the first liquid supply operation.

In the liquid film heating operation, the substrate may be rotated at the first speed, and the first liquid may not be supplied onto the substrate.

Still another exemplary embodiment of the present invention provides a method of treating a substrate by using the apparatus of treating the substrate, the method including: a first liquid supply operation of supplying a first liquid to a substrate rotating at a first speed in an open state in which the chuck pin is located at the open position and forming a first liquid film on the substrate; a liquid film heating operation of heating the first liquid film formed on the substrate in the open state in which the chuck pin is located at the open position, after the first liquid supply operation; and a second liquid supply operation of supplying a second liquid to the substrate rotating at a second speed faster than the first speed in a contact state in which the chuck pin is located at the contact position, after the liquid film heating operation, in which the change of the chuck pin from the open state to the contact state is performed while the substrate is being rotated.

According to the exemplary embodiment of the present invention, it is possible to efficiently treat a substrate.

Further, according to the exemplary embodiment of the present invention, the chuck pin may be freely moved while the process is performed by rotating the substrate.

Further, according to the exemplary embodiment of the present invention, it is possible to prevent the processing liquid from flowing down to the chuck pin.

Further, according to the exemplary embodiment of the present invention, the processing liquid puddle formed on the substrate may be maintained as a liquid film of a predetermined amount or more.

Further, according to the exemplary embodiment of the present invention, the chuck pin may be normally moved regardless of whether the support unit supporting the substrate is rotated or is not rotated.

Further, according to the exemplary embodiment of the present invention, it is possible to adjust the movement stroke of the chuck pin during the process.

Further, according to the exemplary embodiment of the present invention, through the support unit in which a hollow space is formed, various types of heat sources and cooling systems of various heat sources may be applied.

The effect of the present invention is not limited to the foregoing effects, and those skilled in the art may clearly understand non-mentioned effects from the present specification and the accompanying drawings.

DETAILED DESCRIPTION

Figure 1:
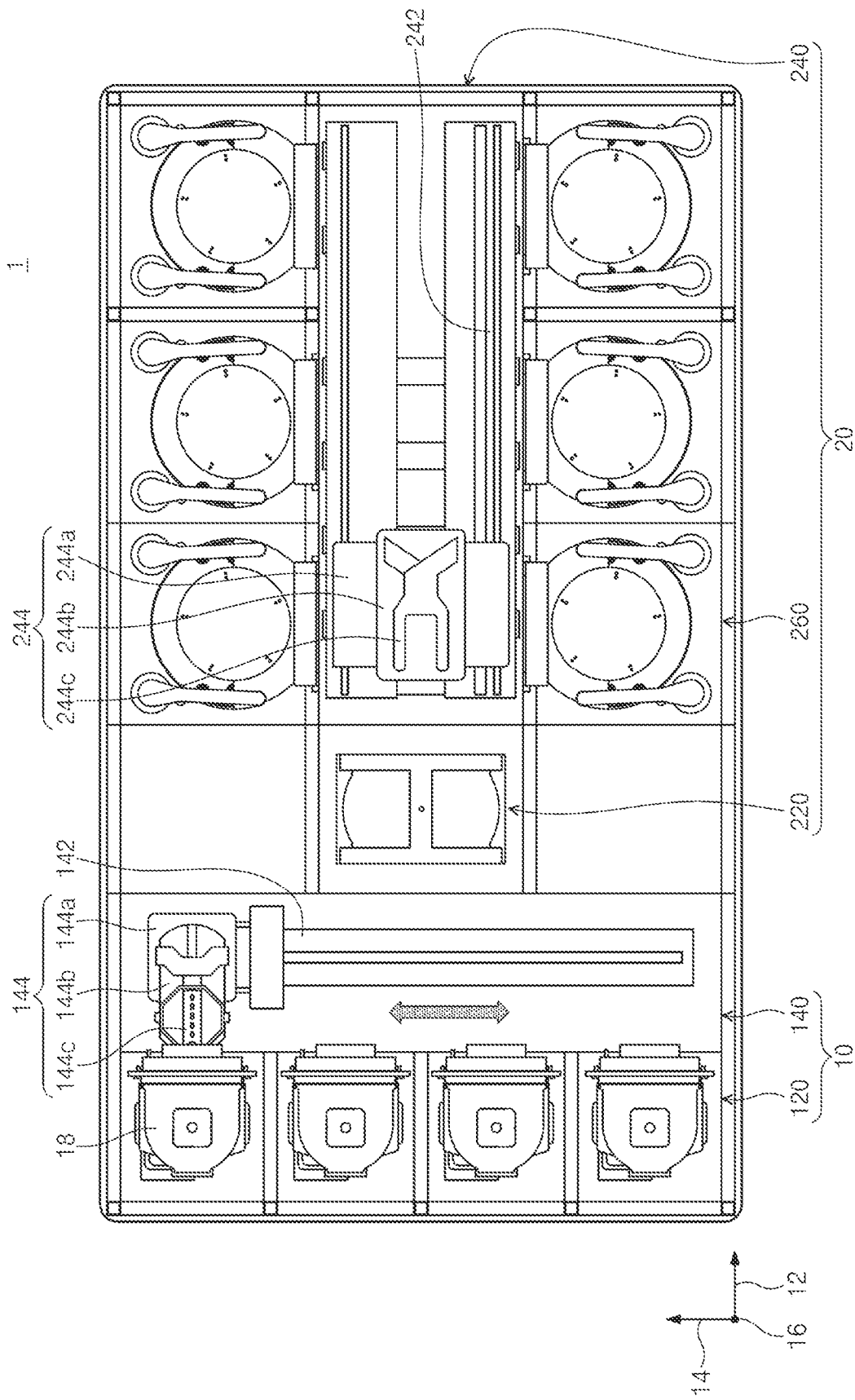
FIG. 1 is a top plan view illustrating a substrate treating facility according to an exemplary embodiment of the present invention.

Hereinafter, an exemplary embodiment of the present invention will be described more fully hereinafter with reference to the accompanying drawings, in which exemplary embodiments of the invention are illustrated. However, the present invention can be variously implemented and is not limited to the following exemplary embodiments. In addition, in describing an exemplary embodiment of the present invention in detail, if it is determined that a detailed description of a related well-known function or configuration may unnecessarily obscure the gist of the present invention, the detailed description thereof will be omitted. In addition, the same reference numerals are used throughout the drawings for parts having similar functions and actions.

In addition, unless explicitly described to the contrary, the word "comprise" and variations such as "comprises" or "comprising" will be understood to imply the inclusion of stated elements but not the exclusion of any other elements. It will be appreciated that terms "including" and "having" are intended to designate the existence of characteristics, numbers, operations, operations, constituent elements, and components described in the specification or a combination thereof, and do not exclude a possibility of the existence or addition of one or more other characteristics, numbers, operations, operations, constituent elements, and components, or a combination thereof in advance.

Singular expressions used herein include plurals expressions unless they have definitely opposite meanings in the context. Accordingly, shapes, sizes, and the like of the elements in the drawing may be exaggerated for clearer description.

An expression, "and/or" includes each of the mentioned items and all of the combinations including one or more of the items. Further, in the present specification, "connected" means not only when member A and member B are directly connected, but also when member A and member B are indirectly connected by interposing member C between member A and member B.

The exemplary embodiment of the present invention may be modified in various forms, and the scope of the present invention should not be construed as being limited to the following exemplary embodiments. The present exemplary embodiment is provided to more completely explain the present invention to those skilled in the art. Therefore, the shapes of elements in the drawings are exaggerated to emphasize clearer descriptions.

In the present exemplary embodiment, a process of etching a substrate by using a processing liquid will be described as an example. However, the present exemplary embodiment is not limited to the etching process, and is variously applicable to substrate treating processes using liquids, such as a cleaning process, an ashing process, and a developing process.

Here, the substrate is a comprehensive concept including all substrates used for manufacturing semiconductor devices, Flat Panel Displays (FPDs), and other articles in which circuit patterns are formed on thin films. Examples of the substrate W include a silicon wafer, a glass substrate, and an organic substrate.

Hereinafter, an example of the present invention will be described in detail with reference to FIGS. 1 to 13.

FIG. 1 is a top plan view illustrating a substrate treating facility according to an exemplary embodiment of the present invention. Referring to FIG. 1, the substrate treating facility 1 includes an index module 10 and a process processing module 20.

The index module 10 includes a load port 120 and a transfer frame 140. The load port 120, the transfer frame 140, and the process processing module 20 may be sequentially arranged in series. Hereinafter, a direction in which the load port 120, the transfer frame 140, and the process processing module 20 are arranged is called to as a first direction 12, and a direction perpendicular to the first direction 12 when viewed from the top is called a second direction 14, and a direction perpendicular to a plane including the first direction 12 and the second direction 14 is called a third direction 16.

A carrier 18 in which a substrate W is accommodated is seated on the load port 120. The load port 120 is provided in plurality, and the plurality of load ports 120 is arranged in series in the second direction 14. The number of load ports 120 may be increased or decreased according to process efficiency of the process processing module 20 and a condition of foot print, and the like. A plurality of slots (not illustrated) for accommodating the plurality of substrates W in a state where the substrates W are arranged horizontally with respect to the ground may be formed in the carrier 18. As the carrier 18, a Front Opening Unified Pod (FOUP) may be used.

The transfer frame 1400 transfers the substrate W between the carrier 18 seated on the load port 1200 and the buffer unit 220. In the transfer frame 140, an index rail 142 and an index robot 144 are provided. A longitudinal direction of the index rail 142 is provided to be parallel to the second direction 14. The index robot 144 is installed on the index rail 142, and linearly moves in the second direction 14 along the index rail 142. The index robot 144 includes a base 144a, a body 144b, and an index arm 144c. The base 144a is installed to be movable along the index rail 142. The body 144b is coupled to the base 144a. The body 144b is provided to be movable in the third direction 16 on the base 144a. Further, the body 144b is provided to be rotatable on the base 144a. The index arm 144c is coupled to the body 144b and is provided to be movable forwardly and backwardly with respect to the body 144b. A plurality of index arms 144c is provided to be individually driven. The index arms 144c are disposed to be stacked in the state of being spaced apart from each other in the third direction 16. A part of the index arms 144c may be used when the substrate W is transferred from the process processing module 20 to the carrier 18, and another part of the plurality of index arms 144c may be used when the substrate W is transferred from the carrier 18 to the process processing module 20. This may prevent particles generated from the substrate W before the process processing from being attached to the substrate W after the process processing in the process of loading and unloading the substrate W by the index robot 144.

The process module 20 includes a buffer unit 220, a transfer chamber 240, and a process chamber 260.

The buffer unit 220 is disposed between the transfer frame 140 and the transfer chamber 240. The buffer unit 220 provides a space in which the substrate W stays before the substrate W is transferred between the transfer chamber 240 and the transfer frame 140. A slot (not illustrated) in which the substrate W is placed is provided inside the buffer unit 220. A plurality of slots (not illustrated) is provided so as to be spaced apart from each other in the third direction 16. The buffer unit 220 has an open side facing the transfer frame 140. The buffer unit 220 has an open side facing the transfer chamber 240.

The transfer chamber 240 is disposed so that a longitudinal direction thereof is parallel to the first direction 12. The transfer chamber 240 may include one side of the transfer chamber 240 and the other side located opposite to the one side. The plurality of process chambers 260 may be disposed on one side or the other side of the transfer chamber 240. The plurality of process chambers 260 may be disposed on both sides of the transfer chamber 240. The plurality of process chambers 260 disposed on one side of the transfer chamber 240 and the plurality of process chambers 260 disposed on the other side of the transfer chamber 240 may be provided symmetrically with respect to the transfer chamber 240. Some of the plurality of process chambers 260 may be disposed along the longitudinal direction of the transfer chamber 240. In addition, some of the plurality of process chambers 260 are disposed to be stacked on each other in the third direction 16. That is, on one side of the transfer chamber 240, the process chambers 260 may be arranged in an arrangement of A ?B. Here, A is the number of process chambers 260 provided in a line along the first direction 12, and B means the number of process chambers 260 provided in a line along the third direction 16. For example, when four or six process chambers 260 are provided on one side of the transfer chamber 240, the plurality of process chambers 260 may be arranged in an arrangement of 2×2 or 3×2. The number of process chambers 260 may be increased or decreased. The number of process chambers 260 may be provided in various numbers according to a footprint or process efficiency. Unlike the above, the process chamber 260 may be provided on only one side of the transfer chamber 240. In addition, the process chamber 260 may be provided as a single layer on one side and both sides of the transfer chamber 240.

The transfer chamber 2400 transfers the substrate W between the buffer unit 2200 and the process chamber 260, and between the process chambers 260. A guide rail 242 and a main robot 244 are provided to the transfer chamber 240. The guide rail 242 is disposed so that its longitudinal direction is parallel to the first direction 12. The main robot 244 is installed on the guide rail 242 and linearly moved along the first direction 12 on the guide rail 242. The main robot 244 includes a base 244a, a body 244b, and a main arm 244c. The base 244a is installed to be movable along the guide rail 242. The body 244b is coupled to the base 244a. The body 244b is provided to be movable in the third direction 16 on the base 244a. Further, the body 244b is provided to be rotatable on the base 244a. The main arm 244c is coupled to the body 244b, and provided to be movable forwardly and backwardly with respect to the body 244b. A plurality of main arms 244c is provided to be individually driven. The main arms 244c are disposed to be stacked in the state of being spaced apart from each other in the third direction 16.

A substrate treating apparatus 300 performing a liquid processing process on the substrate W is provided to the process chamber 260. The substrate treating apparatus 300 may have a different structure depending on the type of liquid processing process to be performed. Contrary to this, the substrate treating apparatus 300 within each process chamber 260 may have the same structure. Optionally, the plurality of process chambers 260 is divided into a plurality of groups, and the substrate treating apparatuses 300 within the process chambers 260 belong to the same group may have the same structure, and the substrate treating apparatuses 300 within the process chambers 260 belong to the different groups may have the different structures.

FIG. is a cross-sectional view illustrating a substrate treating apparatus provided in a process chamber of FIG. 1 according to an exemplary embodiment of the present invention.

Figure 2:
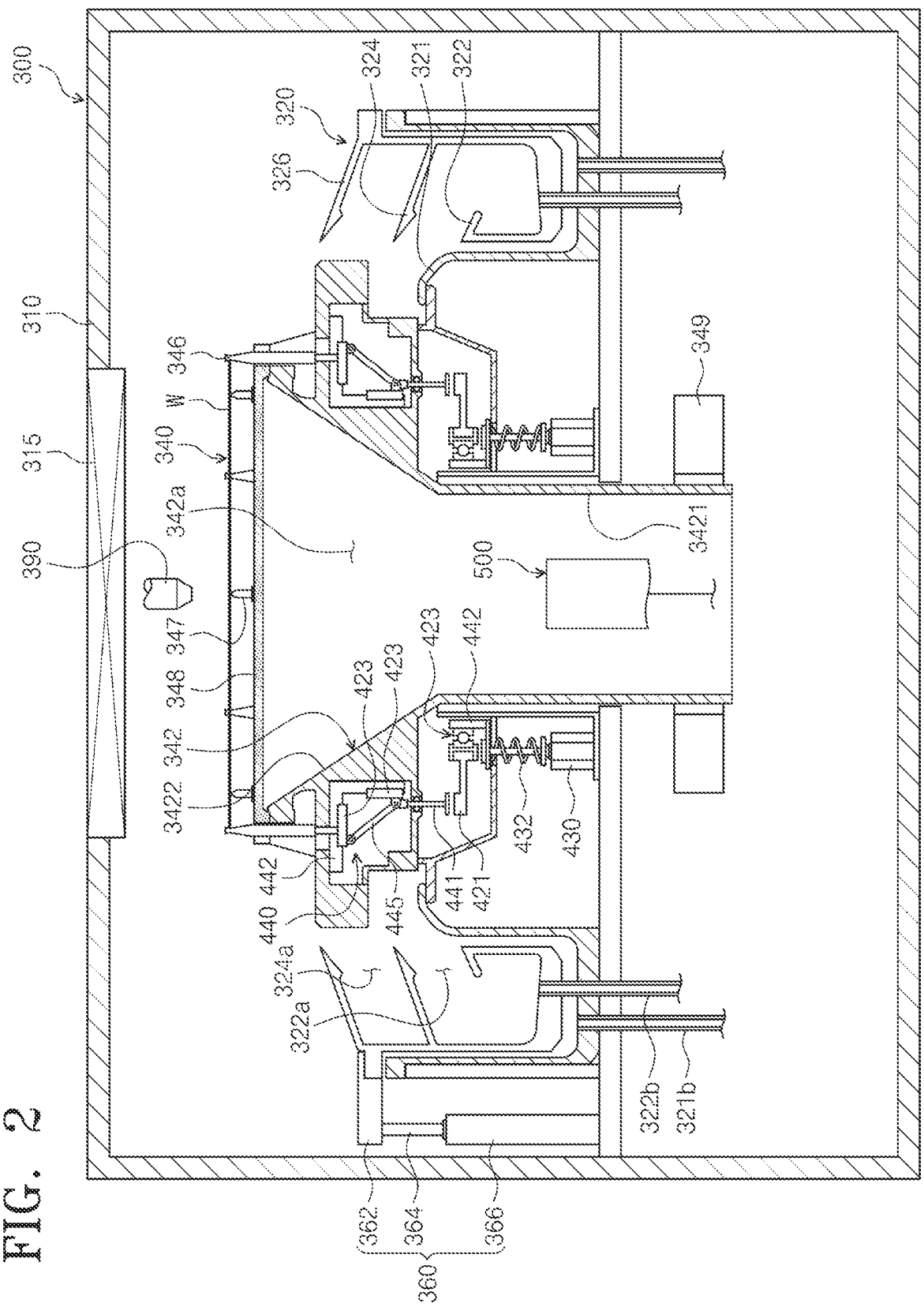
FIG. 2 is a cross-sectional view illustrating a substrate treating apparatus provided in a process chamber of FIG. 1 according to an exemplary embodiment of the present invention.

Referring to FIG. 2, the substrate treating apparatus 300 includes a processing vessel 320, a substrate support unit 340, a lifting unit 360, a liquid supply unit 390, and a heating unit 500.

The substrate treating apparatus 300 may include a chamber 310. The chamber 310 provides a sealed inner space. The processing vessel 320 is disposed in the inner space of the chamber 310. A fan filter unit 315 is installed at the upper portion of the chamber 310. The fan filter unit 315 generates a vertical airflow in the chamber 310. The fan filter unit 315 generates a downward airflow in the chamber 310. The fan filter unit 315 is a device in which a filter and an air supply fan are modularized as one unit, and which filters high-humidity outdoor air and supplies the filtered air to the inside of the chamber 310. The high-humidity outdoor air passes through the fan filter unit 315 and is supplied into the chamber 310, and forms a vertical airflow in the inner space of the chamber 310. This vertical airflow provides a uniform airflow in the upper portion of the substrate W. Contaminants (for example, fumes) generated in the process of treating the substrate W are discharged to the outside of the processing vessel 320 together with the air included in the vertical airflow, and through this, the inside of the processing vessel 320 may maintain a high degree of cleanliness.

The treating vessel 320 has a cylindrical shape with an open top. The processing vessel 320 includes a first recovery container 321 and a second recovery container 322. The recovery containers 321 and 322 recovers different processing liquids among the processing liquids used for the process. The first recovery container 321 is provided in an annular ring shape surrounding the substrate support unit 340. The second recovery container 322 is provided in the shape of an annular ring surrounding the substrate support unit 340. In one exemplary embodiment, the first recovery container 321 is provided in an annular ring shape surrounding the second recovery container 322. The second recovery container 322 may be provided by being inserted into the first recovery container 321. The height of the second recovery container 322 may be higher than the height of the first recovery container 321. The second recovery container 322 may include a first guard part 326 and a second guard part 324. The first guard part 326 may be provided at the top of the second recovery container 322. The first guard part 326 is formed to extend toward the substrate support unit 340, and the first guard part 326 may be formed to be inclined upward toward the substrate support unit 340. In the second recovery container 322, the second guard part 324 may be provided at a position spaced downward from the first guard part 326. The second guard part 324 is formed to extend toward the substrate support unit 340, and the second guard part 324 may be formed to be inclined upward toward the substrate support unit 340. The space between the first guard part 326 and the second guard part 324 functions as a first inlet 324a through which the processing liquid flows. A second inlet 322a is provided at a lower portion of the second guard part 324. The first inlet 324a and the second inlet 322a may be located at different heights. A hole (not illustrated) is formed in the second guard part 324 so that the processing liquid flowing into the first inlet 324a flows into a second recovery line 322b provided in the lower portion of the second recovery container 322. A hole (not illustrated) of the second guard part 324 may be formed at a position with the lowest height in the second guard part 324. The processing liquid recovered to the first recovery container 321 is configured to flow into the first recovery line 321*b* connected to the bottom surface of the first recovery container 321. The processing liquids introduced into the recovery containers 321 and 322 may be provided to an external processing liquid recycling system (not illustrated) through the recovery lines 321*b* and 322*b*, respectively, to be re-used.

The lifting unit 360 linearly moves the processing vessel 320 up and down. As an example, the lifting unit 360 is coupled to the second recovery container 322 of the processing container 320 and moves the second recovery container 322 up and down, so that the relative height of the processing vessel 320 with respect to the substrate support unit 340 may be changed. The lifting unit 360 includes a bracket 362, a moving shaft 364, and a driver 366. The bracket 362 is fixedly installed on the outer wall of the processing vessel 320, and a moving shaft 364, which is moved in the vertical direction by the driver 366, is fixedly coupled to the bracket 362. The second recovery container 322 of the processing vessel 320 is lowered so that the upper portion of the substrate support unit 340 protrudes toward the upper portion of the processing vessel 320, specifically, protrudes higher than the first guard part 326 when the substrate W is loaded into the substrate support unit 340 or unloaded from the substrate support unit 340. Further, when the process proceeds, the height of the treating vessel 320 is adjusted so that the processing liquid is introduced into the predetermined recovery container 321 and 322 depending on the type of the processing liquid supplied to the substrate W. Optionally, the lifting unit 360 may also move the substrate support unit 340 in the vertical direction instead of the processing vessel 320. Optionally, the lifting unit 360 may move the entire processing vessel 320 to be movable up and down in the vertical direction. The lifting unit 360 is provided to adjust the relative heights of the processing vessel 320 and the substrate support unit 340, and if it is a configuration capable of adjusting the relative heights of the processing vessel 320 and the substrate support unit 340, exemplary embodiments of the processing vessel 320 and the lifting unit 360 may be provided in various structures and methods depending on the design.

The liquid supply unit 390 is configured to discharge a chemical liquid from an upper portion of the substrate W to the substrate W, and may include one or more chemical liquid discharge nozzles. The liquid supply unit 390 may pump the chemical liquid stored in a storage tank (not illustrated) to discharge the chemical liquid to the substrate W through the chemical liquid discharge nozzle. The liquid supply unit 390 may include a driving unit (not illustrated) to be movable between a process position facing the central region of the substrate W and a standby position outside the substrate W.

The chemical liquid supplied from the liquid supply unit 390 to the substrate W may be various depending on the substrate treatment process. When the substrate treatment process is a silicon nitride film etching process, the chemical liquid may be a chemical liquid including phosphoric acid ($H_3PO_4$). The liquid supply unit 390 may further include a deionized water (DIW) supply nozzle for rinsing the surface of the substrate after the etching process, and an isopropyl alcohol (IPA) discharge nozzle and a nitrogen ($N_2$) discharge nozzle for performing a drying process after rinsing. Although not illustrated, the liquid supply unit 390 may include a nozzle moving member (not illustrated) which is capable of supporting the chemical liquid discharge nozzle and moving the chemical liquid discharge nozzle. The nozzle moving member (not illustrated) may include a support shaft (not illustrated), an arm (not illustrated), and a driver (not illustrated). The support shaft (not illustrated) is located at one side of the treating vessel 320. The support shaft (not illustrated) has a rod shape of which a longitudinal direction faces the third direction 16. The support shaft (not illustrated) is provided to be rotatable by the driver (not illustrated). The arm (not illustrated) is coupled to an upper end of the support shaft (not illustrated). The arm (not illustrated) may be extended vertically from the support shaft (not illustrated). The chemical liquid discharge nozzle is fixedly coupled to the distal end of the arm (not illustrated). According to the rotation of the support shaft (not illustrated), the chemical liquid discharge nozzle is capable of swing together with the arm (not illustrated). The chemical liquid discharge nozzle may be swing-moved to move to the process position and the standby position. Optionally, the support shaft (not illustrated) may be provided to be movable up and down. Further, the arm (not illustrated) may be provided to be movable forward and backward toward the longitudinal direction thereof.

The substrate support unit 340 supports the substrate W and rotates the substrate W during the process progress. The substrate support unit 340 includes a spin chuck 342, a window member 348, a rotation driver 349, a chuck pin 346, and a chuck pin moving unit 400.

The chuck pin 346 is coupled to the spin chuck 342. The substrate W is spaced apart from the upper surface of the spin chuck 342 by the chuck pin 346 coupled to the spin chuck 342. The substrate W is rotated together with the spin chuck 342 while being supported by the chuck pin 346 coupled to the spin chuck 342.

The spin chuck 342 is provided in the shape of a tank having an open top and an open bottom. The spin chuck 342 includes a through-hole 342*a* penetrating through the upper surface and the lower surface. The spin chuck 342 includes the through-hole 342*a* penetrating in the vertical direction. In this case, the vertical direction may refer to an axial direction of the spin chuck 342 or a direction parallel to a rotational axis direction of the spin chuck 342. The heating unit 500 to be described later is disposed in the through-hole 342*a*.

The spin chuck 342 includes a body portion 3421 and an extension portion 3422 extending upwardly from the body portion 3421. The body portion 3421 and the extension portion 3422 are integrally formed. The through-hole 342*a* is formed to pass through both the body portion 3421 and the extension portion 3422. The body portion 3421 is formed to have the same area. The body portion 3421 is formed to have the same inner diameter. The through-hole 342*a* in the body portion 3421 is formed to have the same diameter. The extension portion 3422 is formed to gradually increase in area from the body portion 3421 in the upper direction. The inner diameter of the extension portion 3422 is formed to increase in the upper direction. The through-hole 342*a* in the extension portion 3422 is formed to increase in diameter in the upper direction. The heating unit 500 to be described later is disposed inside the body 3421, and a laser beam generated from the heating unit 500 is emitted to the substrate W through the extension portion 3422. The extension 3422 may be formed in a size that does not interfere with the laser beam. Through this, the laser beam generated by the heating unit 500 may be emitted to the substrate W without being interfered by the spin chuck 342.

The spin chuck 342 may be disposed under the window member 348. The spin chuck 342 may support the edge region of the window member 348. A connection part between the spin chuck 342 and the window member 348 may have a sealing structure so that the chemical liquid supplied to the substrate W does not penetrate into the heating unit 500.

The window member 348 is located under the substrate W. The window member 348 is provided under the substrate W supported on the chuck pin 346. The window member 348 is provided under the substrate W supported by the chuck pin 346. The window member 348 may be provided in a shape substantially corresponding to the substrate W. For example, when the substrate W is a circular wafer, the window member 348 may be provided in a substantially circular shape. The window member 348 may have a larger diameter than the substrate. However, the present invention is not limited thereto, and the window member 348 may have the same diameter as that of the substrate W or may be formed to have a smaller diameter than that of the substrate W.

A hole 3481 in which the chuck pin 346 is disposed is formed in the window member 348. The chuck pin 346 may pass through the hole 3481 of the window member 348. A diameter of the hole 3481 of the window member 348 may be larger than a diameter of the chuck pin 346. Through this, the chuck pin 346 may move in the inside of the hole 3481 of the window member 348. At this time, the chuck pin 346 is moved in a direction perpendicular to the rotation axis direction of the spin chuck 342.

The window member 348 may be made of a material having high light transmittance. Accordingly, the laser beam emitted from the heating unit 500 may pass through the window member 348. The window member 348 may be made of a material having excellent corrosion resistance so as not to react with the chemical liquid. For example, the window member 348 may be provided of a material such as quartz, glass, or sapphire. The window member 348 is a configuration that allows the laser beam to pass through and reaches the substrate W, and protects the configuration of the substrate support member 340 from a chemical liquid, and may be provided in various sizes and shapes according to design.

A support pin 347 may be coupled to the window member 348. A plurality of support pins 347 may be provided. The support pin 347 may be provided in an edge region of the window member 348. The plurality of support pins 347 may be disposed to be spaced apart from each other along the edge region of the window member 348. The support pin 347 may be provided to protrude upwardly from the upper surface of the window member 348. The support pin 347 may support the lower surface of the substrate W to separate the substrate W from the window member 348.

The rotation driver 349 rotates the spin chuck 342. The rotation driver 349 may be any one capable of rotating the spin chuck 342. As an example, the rotation driver 349 may be provided as a hollow motor. According to the exemplary embodiment, the rotation driver 349 may include a stator (not illustrated) and a rotor (not illustrated). The stator may be provided fixed at one position, and the rotor may be coupled to the spin chuck 342. The rotor may be coupled to the bottom of the spin chuck 342 to rotate the spin chuck 342. When a hollow motor is used as the rotation driver 349, the narrower the bottom of the spin chuck 342 is provided, the smaller the hollow of the hollow motor may be selected. Accordingly, the manufacturing cost may be reduced. According to the exemplary embodiment, a cover member (not illustrated) for protecting the rotation driver 349 from the chemical liquid may be further included.

The chuck pin 346 is installed on the spin chuck 342. The chuck pin 346 may be provided on the spin chuck 346 so as to protrude from the upper surface of the spin chuck 342. The chuck pin 346 may be installed in the extension portion 3422 of the spin chuck 342. The chuck pin 346 rotates with the spin chuck 342. A plurality of chuck pins 346 may be provided. The plurality of chuck pins 346 may be spaced apart from each other. The plurality of chuck pins 346 may be arranged in a circular shape when combined. The plurality of chuck pins 346 may be provided along the edge of the through hole 342a formed in the extension portion 3422. The chuck pin 346 supports the side portion of the substrate W. The chuck pin 346 grips the side portion of the substrate W. The chuck pin 3446 separates the substrate W from the window member 348 by a predetermined distance. At least a portion of the chuck pin 346 may be received in the hole 3481 of the window member 348. The chuck pin 346 may be provided to be movable within the hole 3481 of the window member 348. The chuck pin 346 may be coupled to the chuck pin moving unit 400 to be described later. The chuck pin 346 may be movably provided by the chuck pin moving unit 400. The chuck pin 342 may be provided to be movable between a contact position at which the chuck pin is in contact with the side of the substrate W and an open position at which the chuck pin 342 is spaced apart from the side of the substrate W.

Figure 3:
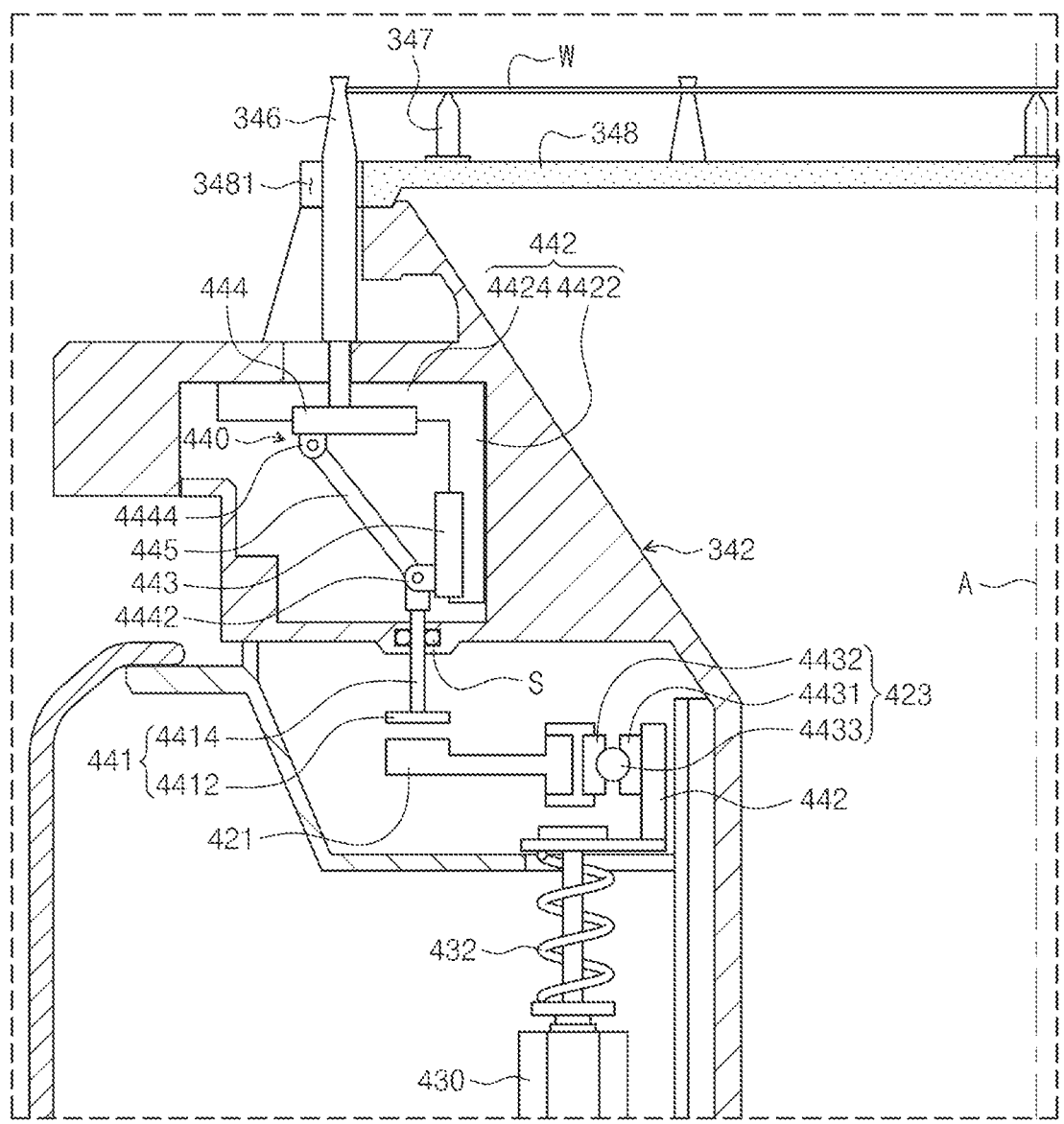
FIG. 3 is a cross-sectional view illustrating a chuck pin and a chuck pin moving unit according to the exemplary embodiment of the present invention.
Figure 4:
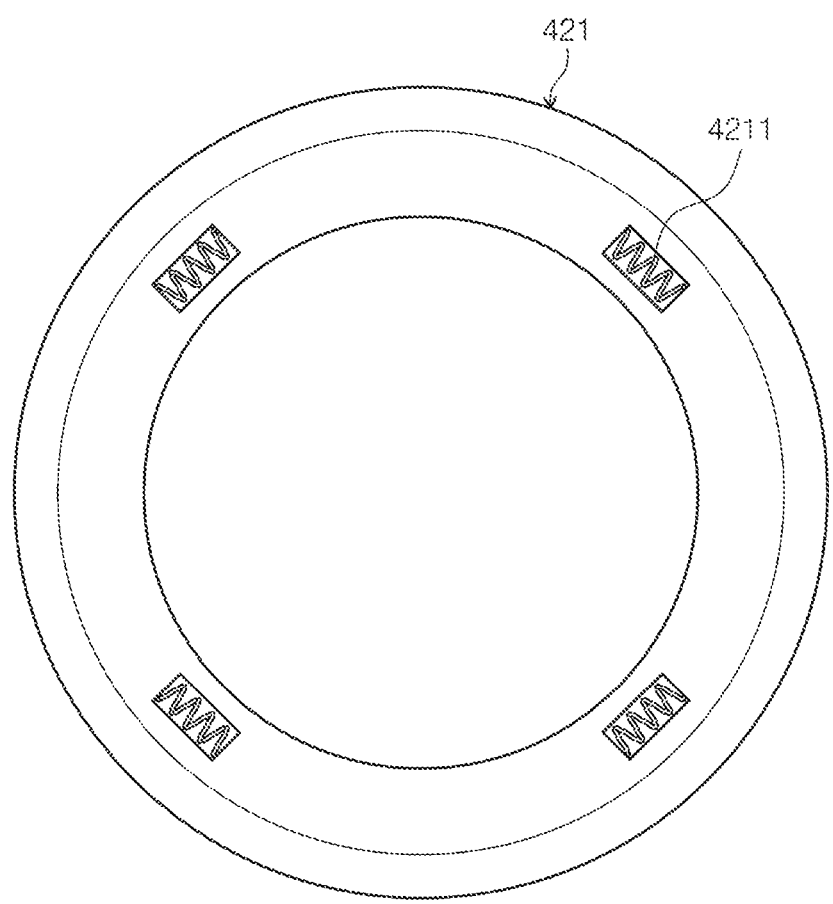
FIG. 4 is a plan cross-sectional view illustrating a state in which an impact mitigating member is installed on a first clutch according to the exemplary embodiment of the present invention.
Figure 5:
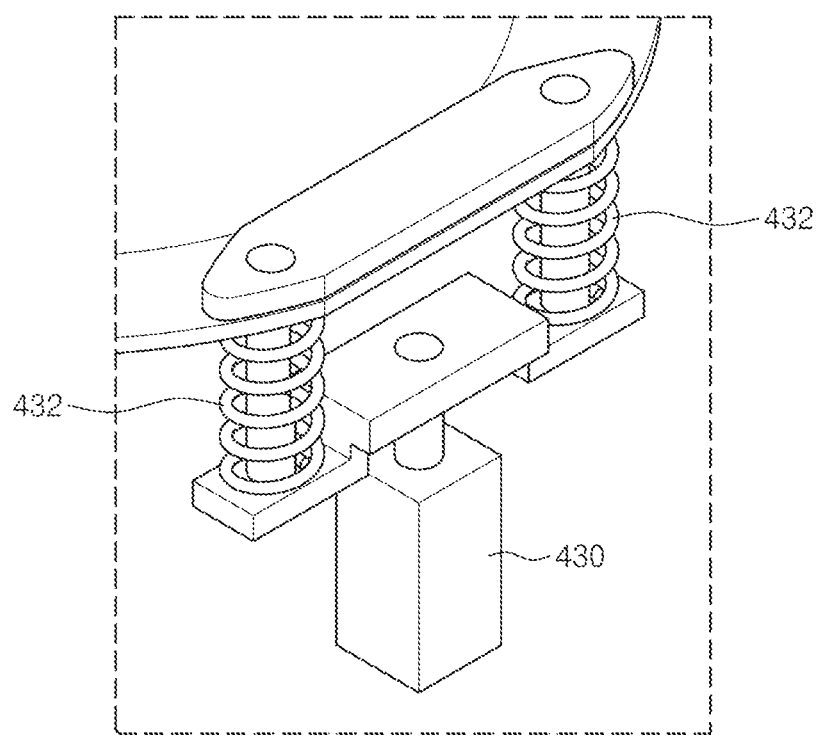
FIG. 5 is a diagram schematically illustrating a state in which an elastic member of a lifting driver is installed according to the exemplary embodiment of the present invention.
Figure 6:
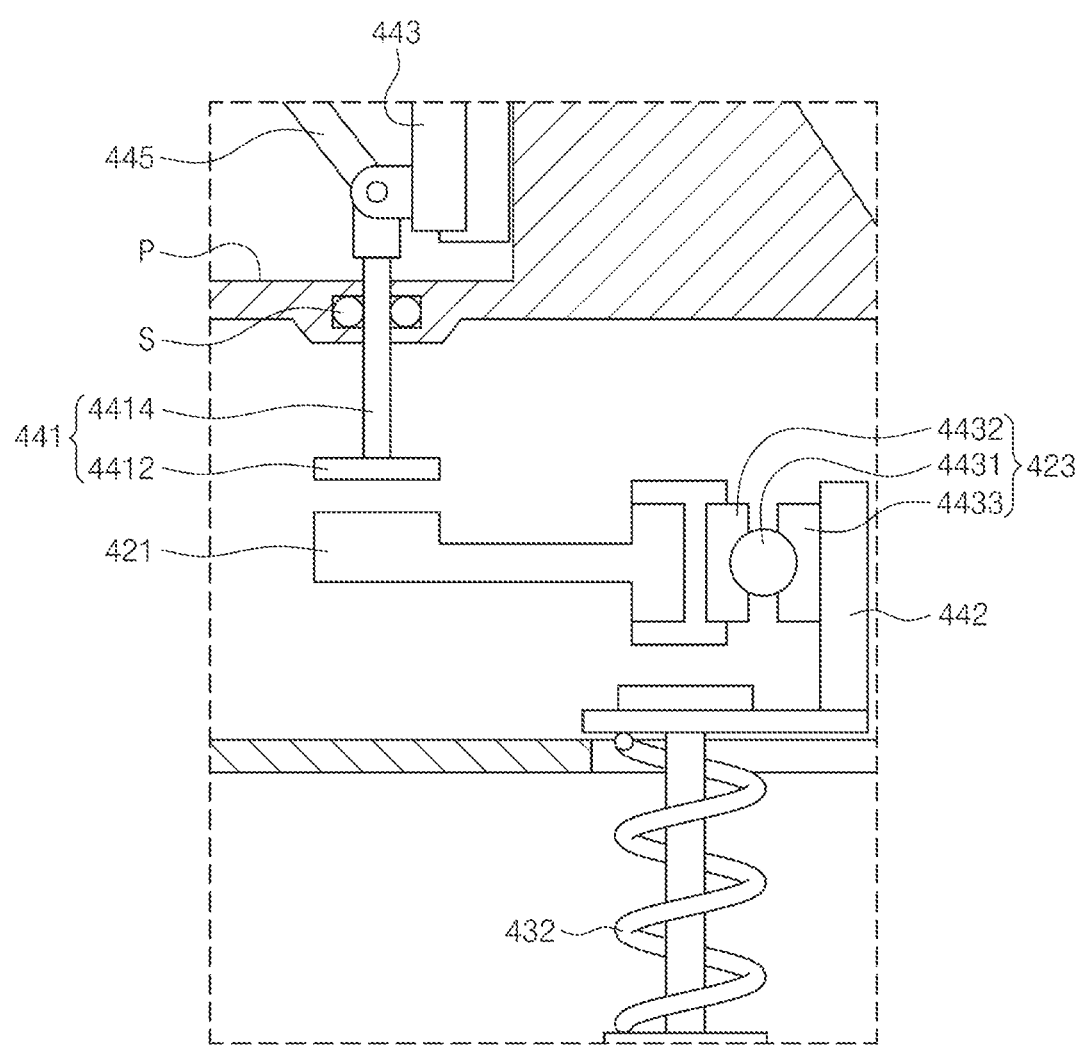
FIG. 6 is a cross-sectional view illustrating a second clutch module according to the exemplary embodiment of the present invention.

FIG. 3 is a cross-sectional view illustrating a chuck pin and a chuck pin moving unit according to the exemplary embodiment of the present invention, FIG. 4 is a plan cross-sectional view illustrating a state in which an impact mitigating member is installed on a first clutch according to the exemplary embodiment of the present invention, FIG. 5 is a diagram schematically illustrating a state in which an elastic member of a lifting driver is installed according to the exemplary embodiment of the present invention, and FIG. 6 is a cross-sectional view illustrating a second clutch module according to the exemplary embodiment of the present invention.

The chuck pin moving unit 400 moves the chuck pin 346. The chuck pin moving unit 400 is coupled to one end of the chuck pin 346 to move the chuck pin 346. The chuck pin moving unit 400 moves the chuck pin 346 in a direction perpendicular to the rotation axis direction of the spin chuck 342. The chuck pin moving unit 400 moves the chuck pin 346 to move between the contact position at which the chuck pin 342 is in contact with the side portion of the substrate W and the open position at which the chuck pin 342 is spaced apart from the side portion of the substrate W. The chuck pin moving unit 400 moves the chuck pin 342 while the spin chuck 342 is being rotated. The chuck pin moving unit 400 may be provided to electrically move the chuck pin 346 of the rotating spin chuck 342 at normal times.

Referring to FIG. 3, the chuck pin moving unit 400 includes a first clutch module 420 and a second clutch module 440. The first clutch module 420 may face the second clutch module 440. At least a portion of the first clutch module 420 may face the second clutch module. The first clutch module 420 may be provided to be movable in the vertical direction. The first clutch module 420 may be moved in an upward direction to come into contact with the first clutch module 440. When the first clutch module 420 comes into contact with the second clutch module 440, the chuck pin 346 may be moved to the open position. The first clutch module 420 may be moved in a descending direction to be spaced apart from the second clutch module 440. When the first clutch module 420 is spaced apart from the second clutch module 440, the chuck pin 346 may be moved to the contact position.

The first clutch module 420 may include a first clutch 421, a fixing member 422, and a bearing member 423.

The first clutch 421 faces the second clutch 441 to be described later. At least a portion of the first clutch 421 faces the second clutch 441. The first clutch 421 is provided to be movable in the vertical direction. The first clutch 421 may be moved in the vertical direction by the lifting driver 430. The first clutch 421 may be moved in an upward direction to come into contact with the second clutch 441. In this case, the chuck pin 346 is moved to the open position. The first clutch 421 may be moved in the descending direction to be spaced apart from the second clutch 441. In this case, the chuck pin 346 is moved to the contact position. The first clutch 421 is rotatably provided. The first clutch 421 does not rotate when the first clutch 421 is spaced apart from the second clutch 441. The first clutch 421 rotates together with the second clutch 441 when the first clutch 421 is in contact with the second clutch 441. The first clutch 421 is rotated together with the spin chuck 342 when the first clutch 421 is in contact with the second clutch 441.

Referring to FIG. 4, the first clutch 421 may include an impact mitigating member 4211. The impact mitigating member 4211 may be installed on the first clutch 421. The impact mitigating member 4211 may be built into the first clutch 421. A plurality of impact mitigating members 4211 may be provided. The plurality of impact mitigating members 4211 may be provided to be spaced apart from each other along the outer circumference of the first clutch 421. The impact mitigating member 4211 may be provided as an elastic member. The impact mitigating member 4211 may be compressed in a rotational direction of the first clutch 421 when the first clutch 421 is rotated. Through this, the rotational impact force generated when the first clutch 421 is rotated while being in contact with the second clutch 441 may be alleviated.

The fixing member 422 does not rotate together with the spin chuck 342. The fixing member 422 is provided to be fixed with respect to the rotating spin chuck 342. The fixing member 422 is provided so as not to be in contact with the spin chuck 342. The fixing member 422 is disposed at a position spaced apart from the outer surface of the spin chuck 342. The fixing member 422 is provided to surround the spin chuck 342. For example, the fixing member 422 may be provided in a ring shape surrounding the spin chuck 342. An inner diameter of the fixing member 422 may be greater than an outer diameter of the spin chuck 342. An inner surface of the fixing member 422 faces at least a portion of an outer surface of the spin chuck 342. In this case, the inner diameter of the fixing member 422 may be larger than the outer diameter of the portion of the spin chuck 342 facing the inner surface of the fixing member 442.

The fixing member 422 does not rotate together with the first clutch 421. The fixing member 422 is provided to be fixed with respect to the first clutch 421 when the first clutch 421 rotates together with the second clutch 441. The fixing member 442 supports the first clutch 421.

The bearing member 423 is provided between the first clutch 421 and the fixing member 422. The bearing member 423 may be provided as a roller bearing, a cross roller bearing, or a ball bearing. The bearing member 423 may include an outer ring 4231, an inner ring 4232, and a ball 4233. The outer ring 4231 is coupled to the fixing member 422. The inner ring 4232 is coupled to the first clutch 421. The ball 4233 is rotatably provided between the outer ring 4231 and the inner ring 4232. The outer ring 4231 is coupled to the fixing member 422 so as not to rotate. The outer ring 4231 is provided to be fixed with respect to the rotating spin chuck 342. The outer ring 4231 is provided to be fixed with respect to the first clutch 421 when the first clutch 421 rotates. The inner ring 4232 is provided to rotate together with the first clutch 421 when the first clutch 421 rotates. The inner ring 4232 is provided not to rotate when the first clutch 421 does not rotate. The ball 4233 may reduce friction caused by rotation when the inner ring 4232 rotates together with the first clutch 421. A plurality of balls 4233 may be provided. The plurality of balls 4233 may be provided to be spaced apart from each other in a space between the outer ring 4231 and the inner ring 4232.

The chuck pin moving unit 400 includes the lifting driver 430. The lifting driver 430 moves the first clutch module 420 in the vertical direction. The lifting driver 430 moves the first clutch 421, the fixing member 422, and the bearing member 423 in the vertical direction. The lifting driver 430 provides driving force so that the first clutch 421, the fixing member 422, and the bearing member 423 are movable in the vertical direction. For example, the lifting driver 430 may be provided as a motor or a cylinder.

The lifting driver 430 may overlap a non-rotating portion of the first clutch module 420 in the direction of the rotation axis of the spin chuck 342. For example, the lifting driver 430 may overlap the fixing member 422 or the outer ring 4231 of the first clutch module 420 in the rotation axis direction of the spin chuck 342. The lifting driver 430 may overlap the fixing member 422 and the outer ring 4231 in the rotation axis direction of the spin chuck 342. The lifting driver 430 may overlap an intermediate point between the fixing member 422 and the outer ring 4231 in the direction of the rotation axis of the spin chuck 342.

Referring to FIG. 5, when the lifting driver 430 is provided as a cylinder, the lifting actuator 430 may include an elastic member 432. The elastic member 432 is provided between the first clutch module 420 and the lifting driver 430. The elastic member 432 may be compressed when the first clutch module 420 is in contact with the second clutch module 440 to alleviate the impact. A plurality of elastic members 432 may be provided. A plurality of elastic members 432 may be provided on both sides based on the center of the lifting driver 430. Through this, when the first clutch module 420 rises and comes into contact with the second clutch module 440, even when the first clutch module 420 is not horizontal to the second clutch module 440, the first clutch module 420 and the second clutch module 440 may be aligned in the horizontal state by the elastic members 432 provided on both sides of the lifting driver 430.

The second clutch module 440 is provided above the first clutch module 420. The second clutch module 440 is vertically spaced apart from the first clutch module 420. The second clutch module 440 is rotated together with the spin chuck 342. The second clutch module 440 is coupled to the chuck pin 346.

The second clutch module 440 includes a second clutch 441, a base member 442, a first moving member 443, a second moving member 444, and a third moving member 445.

The second clutch 441 faces the first clutch 421. When the first clutch 421 rises, the second clutch 441 comes into contact with the first clutch 421. The second clutch 441 may move upward while being in contact with the first clutch 421. The second clutch 441 includes a plate portion 4412 facing the first clutch 421 and a pillar portion 4414 extending upwardly from the plate 4412. The plate 4412 is in contact with the first clutch 421. The pillar portion 4414 is provided to have a direct diameter smaller than the diameter of the plate portion 4412. One end of the pillar portion 4414 is coupled to the plate portion 4412, and the other end of the pillar portion 4414 is coupled to a first moving member 443 to be described later.

The base member 442 is coupled to the spin chuck 342. The base member 442 guides the movement of the chuck pin 346. The base member 442 guides movement of first and second moving members 443 and 444 to be described later. The base member 42 includes a first portion 4422 having a longitudinal direction corresponding to the movement direction (up and down direction) of the first clutch 421, and a second portion 4424 extending from the first portion 4422 and extending in a direction perpendicular to the longitudinal direction of the first portion 4422.

The first moving member 443 is coupled to the base member 442. The first moving member 443 is coupled to the first portion 4422 of the base member 442. The first moving member 443 is movably coupled to the first portion 4422 of the base member 442. The longitudinal direction of the first moving member 443 corresponds to the longitudinal direction of the first portion 4422 of the base member 442. The first moving member 443 is provided movably on the first portion 4422 of the base member 442. The movement direction of the first moving member 443 may be parallel to the longitudinal direction of the first portion 4422 of the base member 442. The first moving member 443 is coupled to the second clutch 441. The first moving member 443 is coupled to the pillar portion 4414 of the second clutch 441. When the second clutch 441 is raised while being in contact with the first clutch 421, the first moving member 443 is moved upwardly together with the second clutch 441. At this time, the first moving member 443 is raised along the first portion 4422 of the base member 442.

The second moving member 444 is coupled to the chuck pin 346. The second moving member 444 is coupled to the base member 442. The second moving member 444 is coupled to the second portion 4424 of the base member 442. The second moving member 444 is movably coupled to the second portion 4424 of the base member 442. The second moving member 444 has a longitudinal direction corresponding to the second portion 4424 of the base member 442. The second moving member 444 is provided movably on the second portion 4424 of the base member 442. When the second clutch 441 is raised in a state of being in contact with the first clutch 421, the second moving unit 444 moves away from the axis of rotation of the spin chuck 342 by the third moving member 445 to be described later. In this case, the chuck pin 346 coupled to the second moving member 444 is moved to the open position.

One end of the third moving member 445 may be coupled to the first moving member 443, and the other end may be coupled to the second moving member 444. One end of the third moving member 445 may be hinged to the first moving member 443, and the other end may be hinged to the second moving member 444. Hereinafter, a portion in which the third moving member 445 is hinged to the first moving member 443 is referred to as a first hinge portion, and a portion in which the third moving member 445 is hinged to the second moving member 444 is referred to as a second hinge portion. The third moving member 445 is rotated at the first hinge portion and the second hinge portion when the first moving member 443 is moved upwardly. The first hinge portion of the third moving member 445 is raised together with the upward movement of the first moving member 443, and the second hinge portion of the third moving member 445 is moved together with the second moving member 444 in a direction away from the rotation axis of the spin chuck 342. In this case, the chuck pin 346 is moved to the open position.

Referring to FIG. 6, a partition wall P may be disposed between the first clutch module 420 and the second clutch module 440. The second clutch 441 may be located between the partition wall P and the first clutch module 420. The plate portion 4412 of the second clutch 441 may be located between the partition wall P and the first clutch module 420. A movement range of the first clutch module 420 or the second clutch 441 in the upward direction may be limited by the partition wall P. A hole through which the pillar portion 4414 of the second clutch 441 passes may be formed in the partition wall P. The diameter of the hole of the partition wall P may be the same as the diameter of the pillar portion 4414 or may be provided to be larger than the diameter of the pillar portion 4414. A sealing member S may be provided between the inner surface of the hole of the partition wall P and the pillar portion of the second clutch. The sealing member S may be provided as an O-ring. Through the sealing member S, the processing liquid supplied to the substrate W may be prevented from flowing to the first clutch module 420 or the lifting driver 430.

Figure 7:
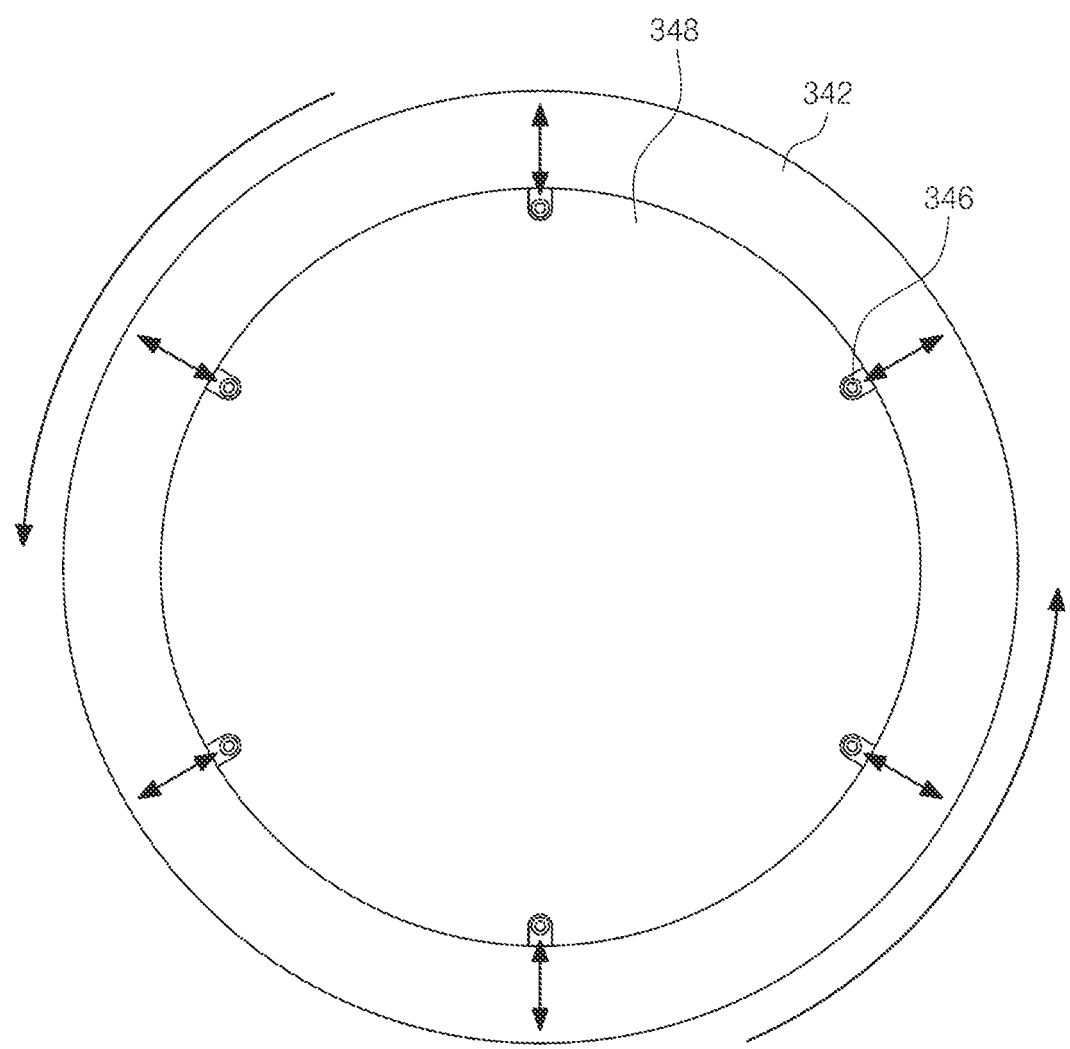
FIG. 7 is a diagram schematically illustrating a state in which a chuck pin is provided movably between a contact position and an open position while a substrate is rotated according to the exemplary embodiment of the present invention.
Figure 8:
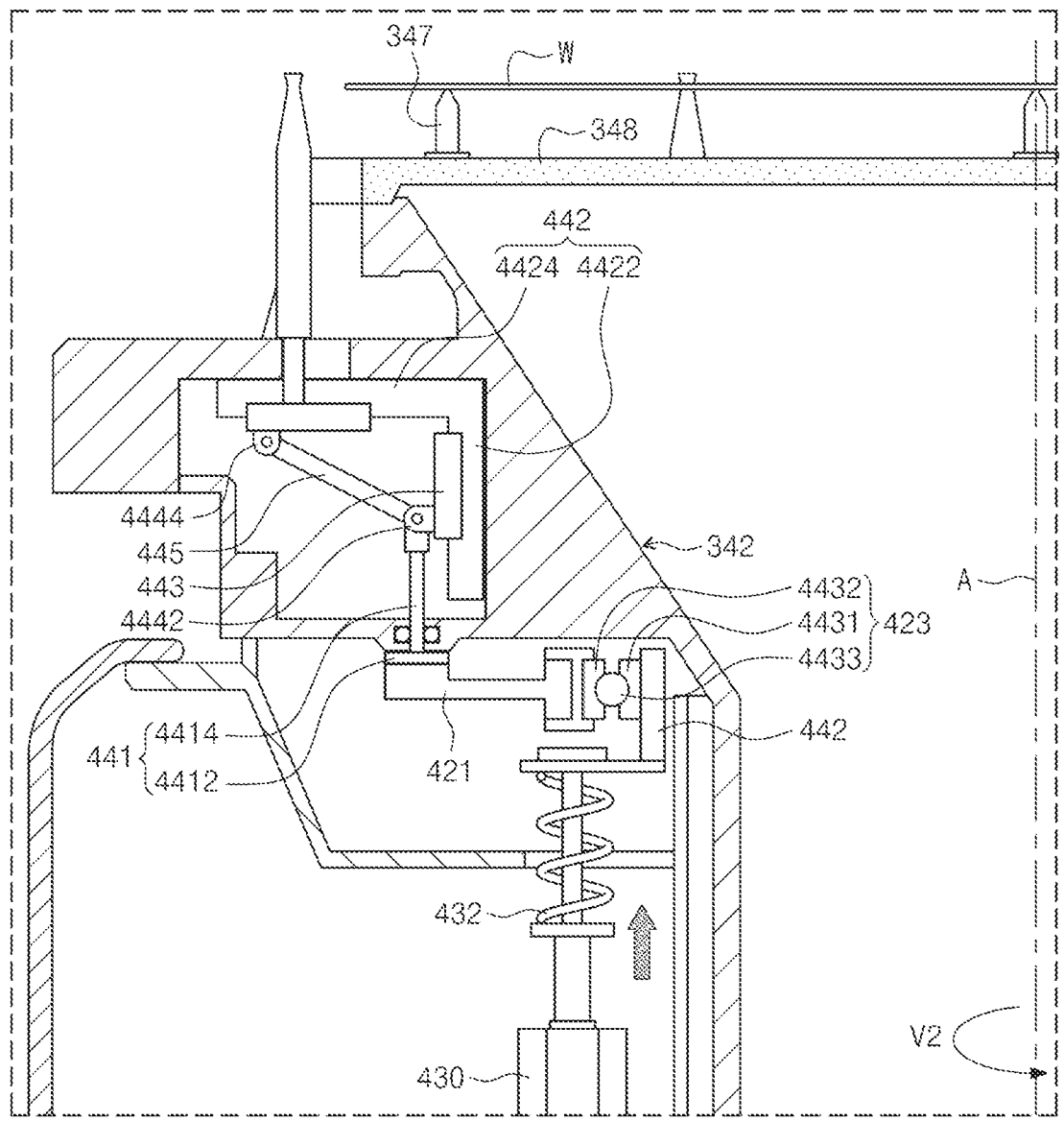
FIG. 8 is a diagram illustrating a state of the chuck pin moving unit when the chuck pin is located at the open position according to the exemplary embodiment of the present invention.
Figure 9:
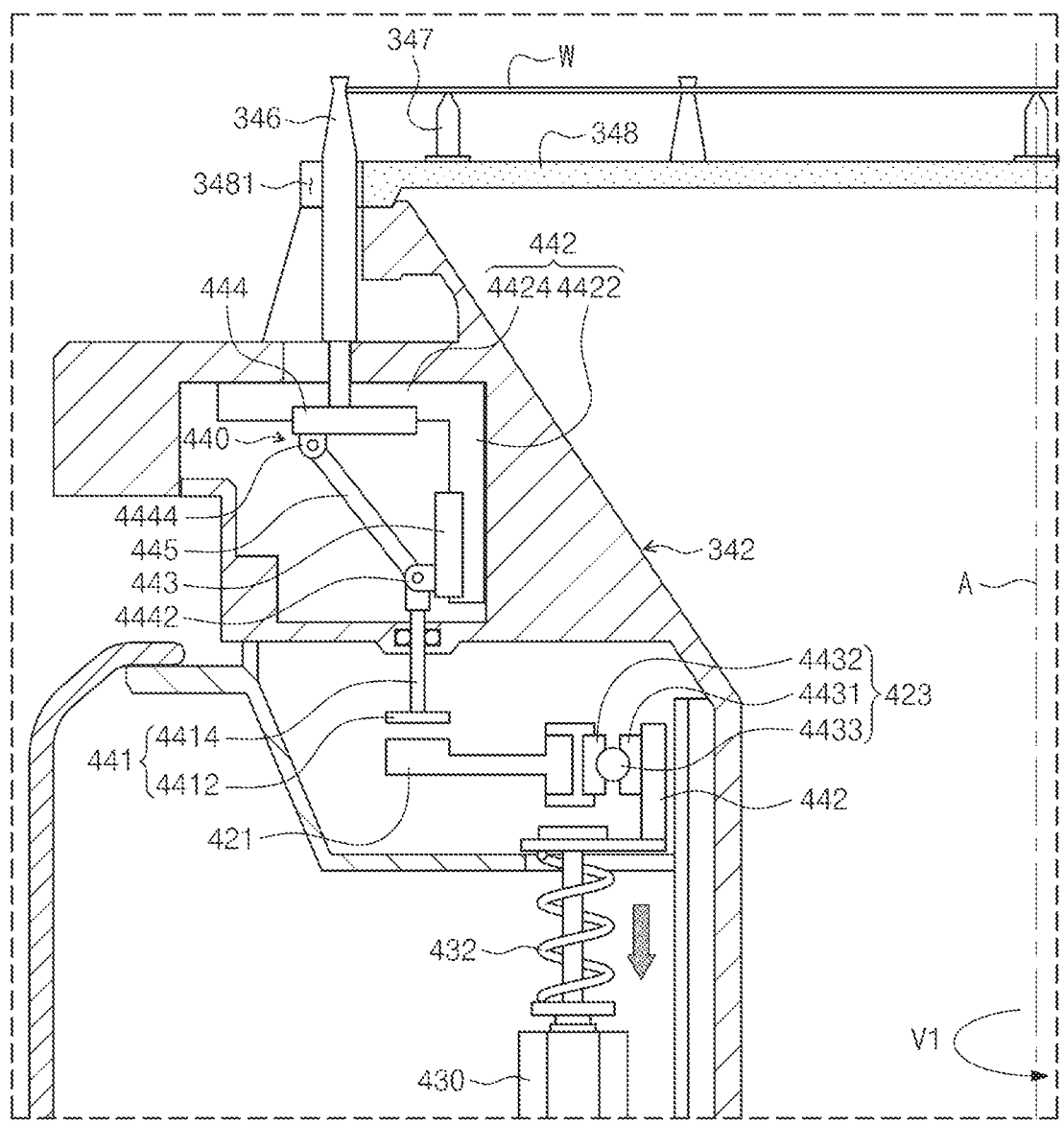
FIG. 9 is a view illustrating a state of the chuck pin moving unit when the chuck pin is located at the contact position according to the exemplary embodiment of the present invention.

FIG. 7 is a diagram schematically illustrating a state in which the chuck pin is provided movably between the contact position and the open position while the substrate is being rotated according to the exemplary embodiment of the present invention, FIG. 8 is a diagram illustrating a state of the chuck pin moving unit when the chuck pin is located at the open position according to the exemplary embodiment of the present invention, and FIG. 9 is a view illustrating a state of the chuck pin moving unit when the chuck pin is located at the contact position according to the exemplary embodiment of the present invention.

Referring to FIG. 7, the chuck pin moving unit 400 may move the chuck pin 346 while the spin chuck 342 or the substrate W is being rotated. The chuck pin moving unit 400 may move the chuck pin 346 between the open position and the contact position while the spin chuck 342 or the substrate W is being rotated. The chuck pin moving unit 400 may always move the chuck pin 346 even though the spin chuck 342 or the substrate W does not stop.

Referring to FIGS. 8 and 9, the spin chuck 342 rotates the substrate W at a first speed v1 or a second speed v2 faster than the first speed v1. Referring to FIG. 8, the chuck pin moving unit 400 moves the chuck pin 346 so that the chuck pin 346 is located at the open position while the substrate W is being rotated at the first speed v1. In this case, the first clutch module 420 is moved in the upward direction by the lifting driver 430. The first clutch 421 comes into contact with the second clutch 441 as the first clutch 421 moves in the upward direction. The first clutch 421 and the second clutch 441 are continuously moved upward by the lifting driver 430 in a contact state. The first clutch 421 and the second clutch 441 are moved upwardly by the lifting driver 430 in the contact state, and are provided to be movable only up to the position of the partition wall P. When the second clutch 441 moves upwardly, the first moving member 443 coupled to the second clutch 441 moves upwardly along the first portion 4422 of the base member 442. When the first moving member 443 moves upwardly, the first hinge portion of the third moving member 445 is raised together with the first moving member 443, and accordingly, the second hinge portion of the third moving member 445 moves the second moving member 444 in a direction away from the rotation axis of the spin chuck 342. The second moving member 444 is pushed in the direction away from the rotation axis of the spin chuck 342 by the third moving member 445, and accordingly, the chuck pin 346 coupled to the second moving member 444 is also moved to the open position.

Referring to FIG. 9, the chuck pin moving unit 400 moves the chuck pin 346 so that the chuck pin 346 is located at the contact position while the substrate W is being rotated at the second speed v2. In this case, the first clutch module 420 is moved in the descending direction by the lifting driver 430. The first clutch 421 is spaced apart from the second clutch 441 as the first clutch 421 moves in the descending direction. When the second clutch 441 is lowered, the first moving member 443 coupled to the second clutch 441 is moved down along the first portion 4422 of the base member 442. When the first moving member 443 is moved downwardly, the first hinge portion of the third moving member 445 is lowered together with the first moving member 443, and accordingly, the second hinge portion of the third moving member 445 moves the second moving member 444 in a direction closer to the rotation axis of the spin chuck 342. The second moving member 444 is pushed in the direction closer to the rotation axis of the spin chuck 342 by the third moving member 445, and accordingly, the chuck pin 346 coupled to the second moving member 444 is moved to the contact position to grip the side portion of the substrate W.

Referring back to FIG. 2, the substrate treating apparatus 300 includes a heating unit 500. The heating unit 500 is a configuration for emitting a laser beam to the substrate W. The heating unit 500 may be located at a lower surface than the window member 348 in the substrate support unit 340. The heating unit 500 may emit a laser beam toward the substrate W located on the substrate support unit 340. The laser beam emitted from the heating unit 500 may pass through the window member 348 of the substrate support unit 340 to be emitted onto the substrate W. Accordingly, the substrate W may be heated to a set temperature. The heating unit 500 may include a laser beam generating member (not illustrated), a laser beam emitting member 500, and a laser beam transmitting member. The laser beam generating member (not illustrated) may be disposed outside the chamber 310. The laser beam emitting member 500 may include, for example, a lens. The laser beam emitting member 500 may include a plurality of lenses. The laser beam emitting member 500 may be provided inside the spin chuck 342. The laser beam emitting member may be provided as a line connecting the laser beam generating member (not illustrated) and the laser beam emitting member 500. The laser beam transmitting member may transmit the laser beam generated from the laser beam generating member (not illustrated) to the laser beam emitting member 500. The laser beam emitting member 500 receiving the laser beam by the laser beam transmitting member may emit the laser beam to the substrate W. In the above, the heating unit 500 has been described as a configuration for emitting a laser beam, but the present invention is not limited thereto, and the heating unit 500 may be provided as a variety of heat sources capable of heating the substrate W. For example, the heating unit 500 may be provided as an LED or a halogen heater.

Hereinafter, a process in which the chuck pin 346 is moved by the chuck pin moving unit 400 will be described in detail with reference to the drawings.

Figure 10:
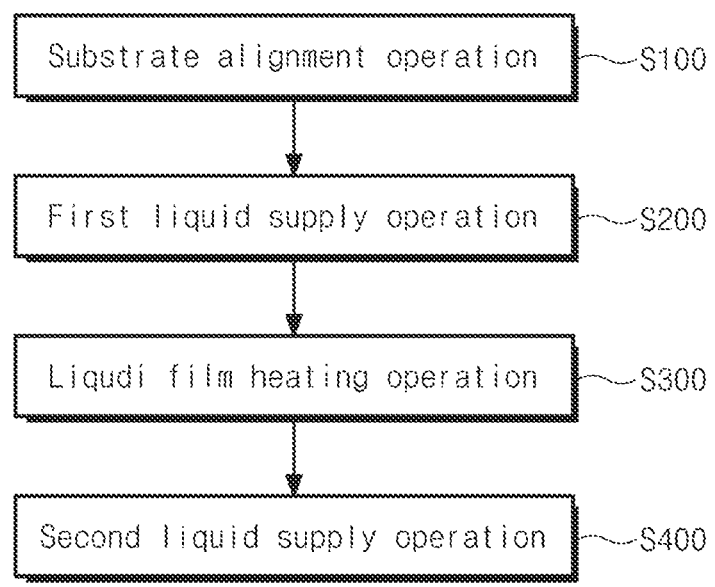
FIG. 10 is a flowchart of a substrate treating method according to an exemplary embodiment of the present invention.

Hereinafter, a substrate treating method according to an exemplary embodiment of the present invention will be described with reference to FIGS. 10 to 14. FIG. 10 is a flowchart of a substrate treating method according to an exemplary embodiment of the present invention, and FIGS. 11 to 14 are diagrams sequentially illustrating the substrate treating method of FIG. 10.

Referring to FIG. 10, the substrate treating method according to the exemplary embodiment of the present invention includes a substrate alignment operation S100, a first liquid supply operation S200, a liquid film heating operation S300, and a second liquid supply operation S400.

Figure 11:
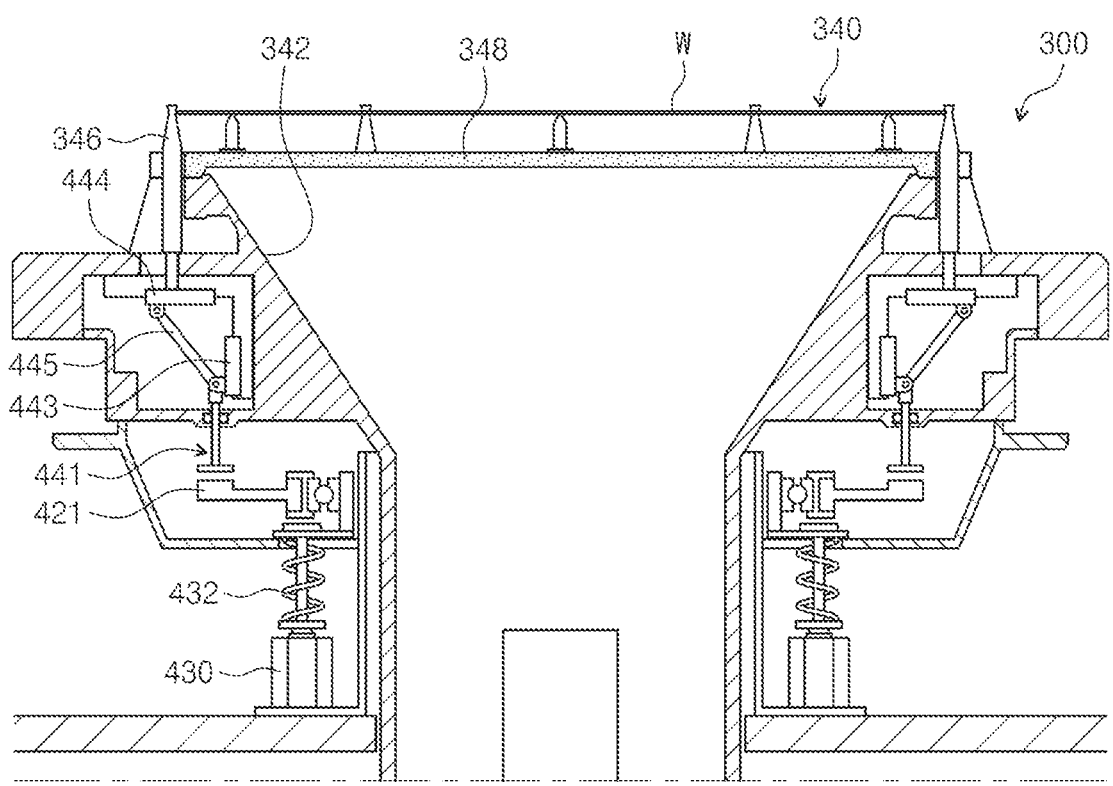
FIGS. 11 to 14 are diagrams sequentially illustrating the substrate treating method of FIG. 10.

FIG. 11 is a diagram illustrating a substrate alignment operation before starting a process according to the substrate treating method according to the exemplary embodiment of the present invention. Referring to FIG. 11, before the process starts, the substrate W is transferred to the substrate support unit 340. After the substrate W is transferred to the upper portion of the spin chuck 342, the center of the substrate W is aligned with the center of the spin chuck 342 or the window member 348. In this case, the chuck pin 346 is located at the open position. When the center of the substrate W and the center of the spin chuck 342 or the window member 348 are aligned, the chuck pin 346 is moved to the contact position to support the side portion of the substrate W. In this case, the chuck pin 346 is moved by the chuck pin moving unit 400.

Figure 12:
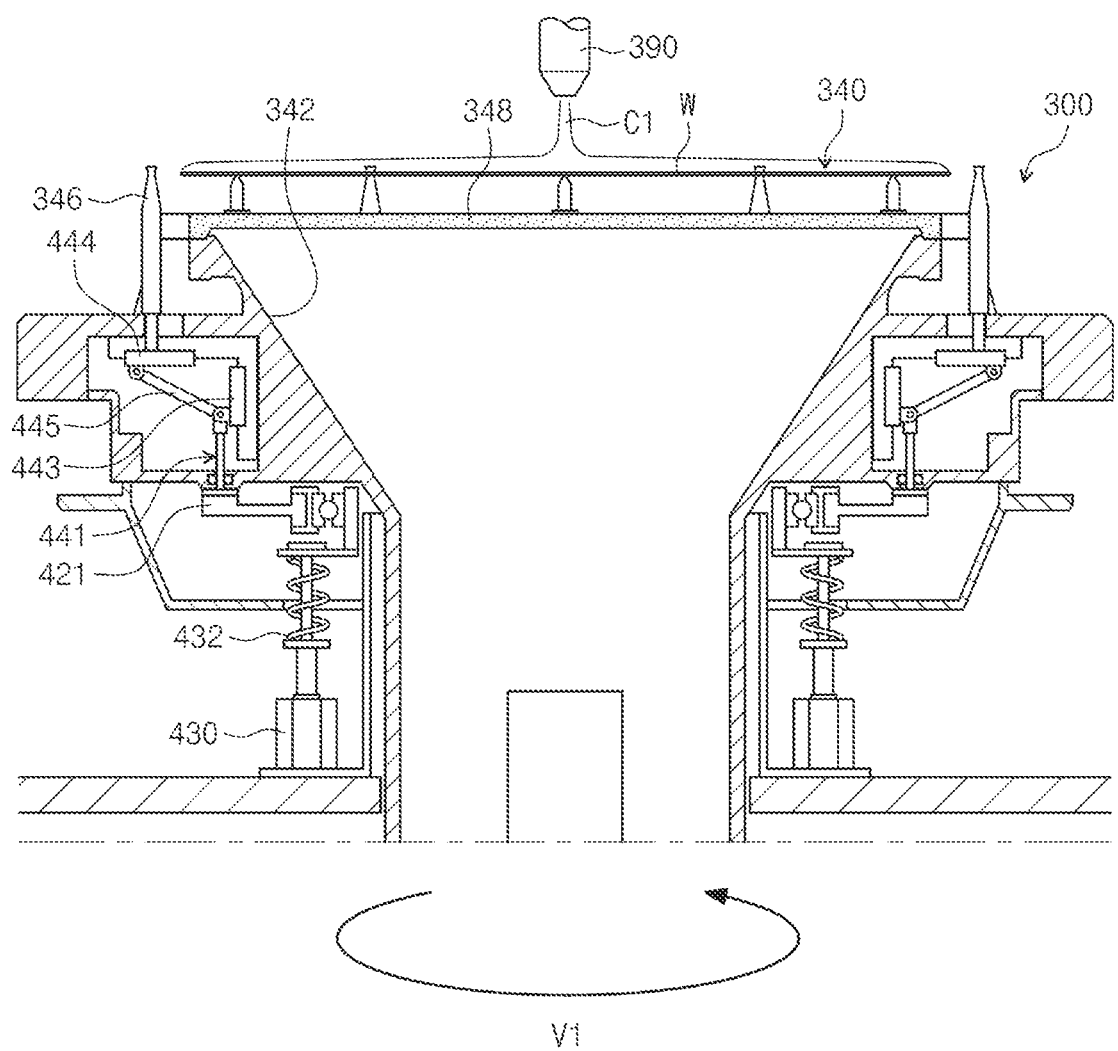

FIG. 12 illustrates a process of forming a processing liquid puddle on the substrate according to the substrate treating method according to the exemplary embodiment of the present invention. Referring to FIG. 12, in a state in which the substrate W is supported by the chuck pin 346 of the substrate support unit 340, the spin chuck 342 rotates the substrate W at a first speed v1. The liquid supply unit 390 forms a first liquid film C1 on the upper surface of the substrate W by supplying a first liquid to the substrate W rotating at the first speed v1. The first liquid film C1 may be a puddle having a predetermined thickness. When the first liquid is supplied to the substrate W, the chuck pin 346 is located at the open position. That is, the first liquid film C1 is formed by supplying the first liquid to the substrate W rotating at the first speed v1 in a state in which the chuck pin 346 is located at the open position at which the chuck pin 346 is spaced apart from the side portion of the substrate W. When the chuck pin 346 is located at the contact position at which the chuck pin 346 is in contact with the side portion of the substrate W when the first liquid film C1 is formed, the first liquid flows down the chuck pin 346, so that there is a problem in that it is difficult to maintain a certain amount of the liquid film. However, according to the substrate treating method according to the exemplary embodiment of the present invention, when the first liquid film C1 is formed, the first liquid film C1 is formed in the state in which the chuck pin 346 is located at the open position at which the chuck pin 346 is spaced apart from the side portion of the substrate W, so that it is possible to prevent the first liquid from flowing down, thereby maintaining a certain amount of liquid film. In addition, as the chuck pin 346 is spaced apart from the side portion of the substrate W, there is an advantage in that the first liquid film (puddle) may be easily formed by the surface tension of the first liquid film C1.

Figure 13:
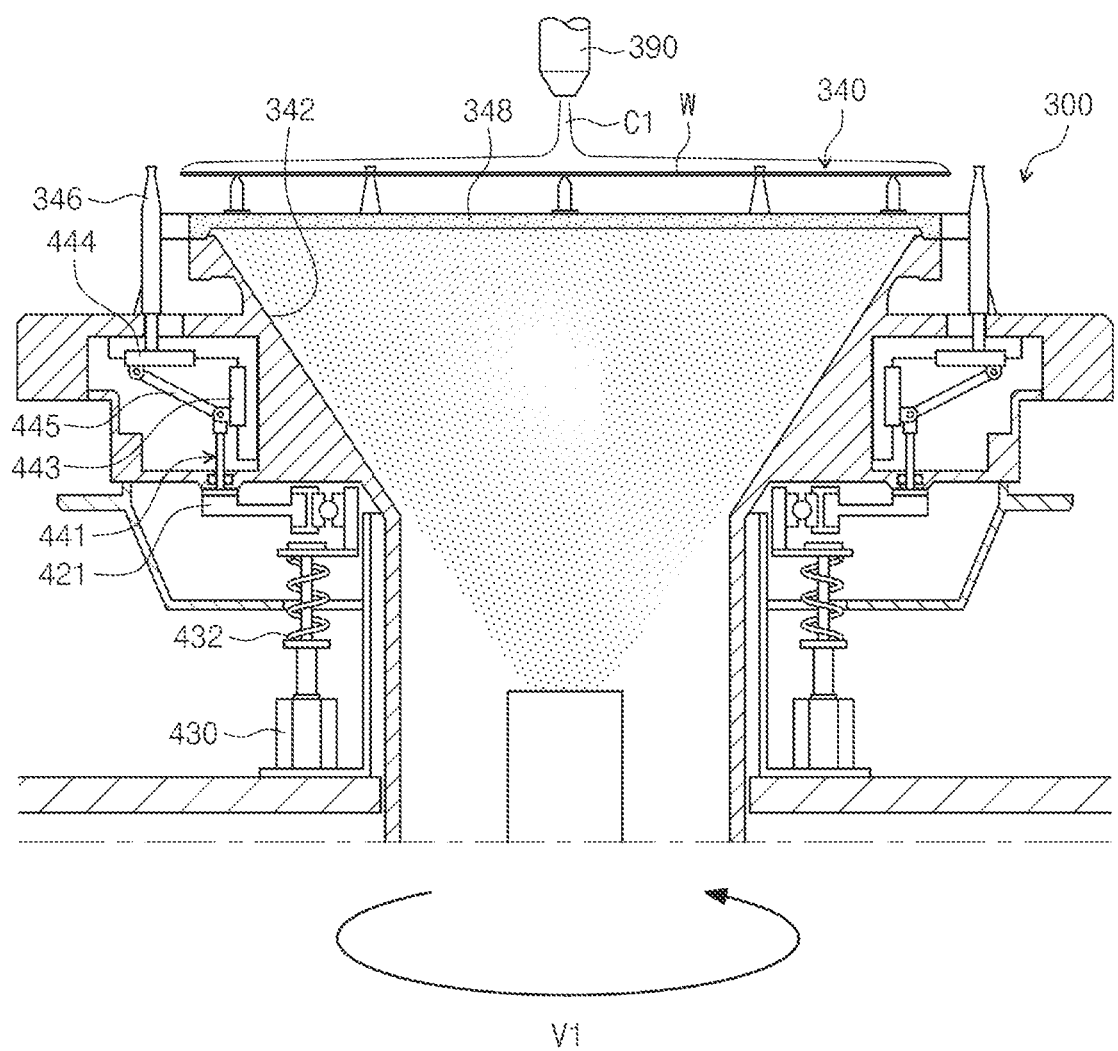

FIG. 13 is a diagram illustrating a operation of heating the first liquid film according to the substrate treating method according to the exemplary embodiment of the present invention. Referring to FIG. 13, when the first liquid film C1 having a predetermined thickness is formed, the rotation of the substrate W is stopped and the supply of the first liquid from the liquid supply unit 390 is stopped. As a result, the surface of the substrate W is covered with the first liquid film C (formation of a puddle of the processing liquid). Here, the treatment liquid may be provided as an aqueous solution of phosphoric acid. The substrate W and the first liquid film C1 are heated to a temperature suitable for treating the substrate W. The substrate W and the first liquid film C1 may be heated by the heating unit 500. At this time, the chuck pin 346 is located at the open position.

As a heat source of the eating unit 500, any one of a laser, an LED, and a halogen heater may be provided. By maintaining the state in which the surface of the substrate W is covered with the first liquid film C1 of the heated processing liquid for a predetermined period of time, the treatment of the substrate W (for example, etching processing (wet etching process)) is performed. At this time, the spin chuck 342 rotates the substrate W at the first speed v1. The first liquid may be stirred on the substrate W by rotating the substrate W about half rotation in the forward rotation and reverse rotation direction. Thereby, etching is facilitated, and the in-plane uniformity of etching amount may be improved.

Figure 14:
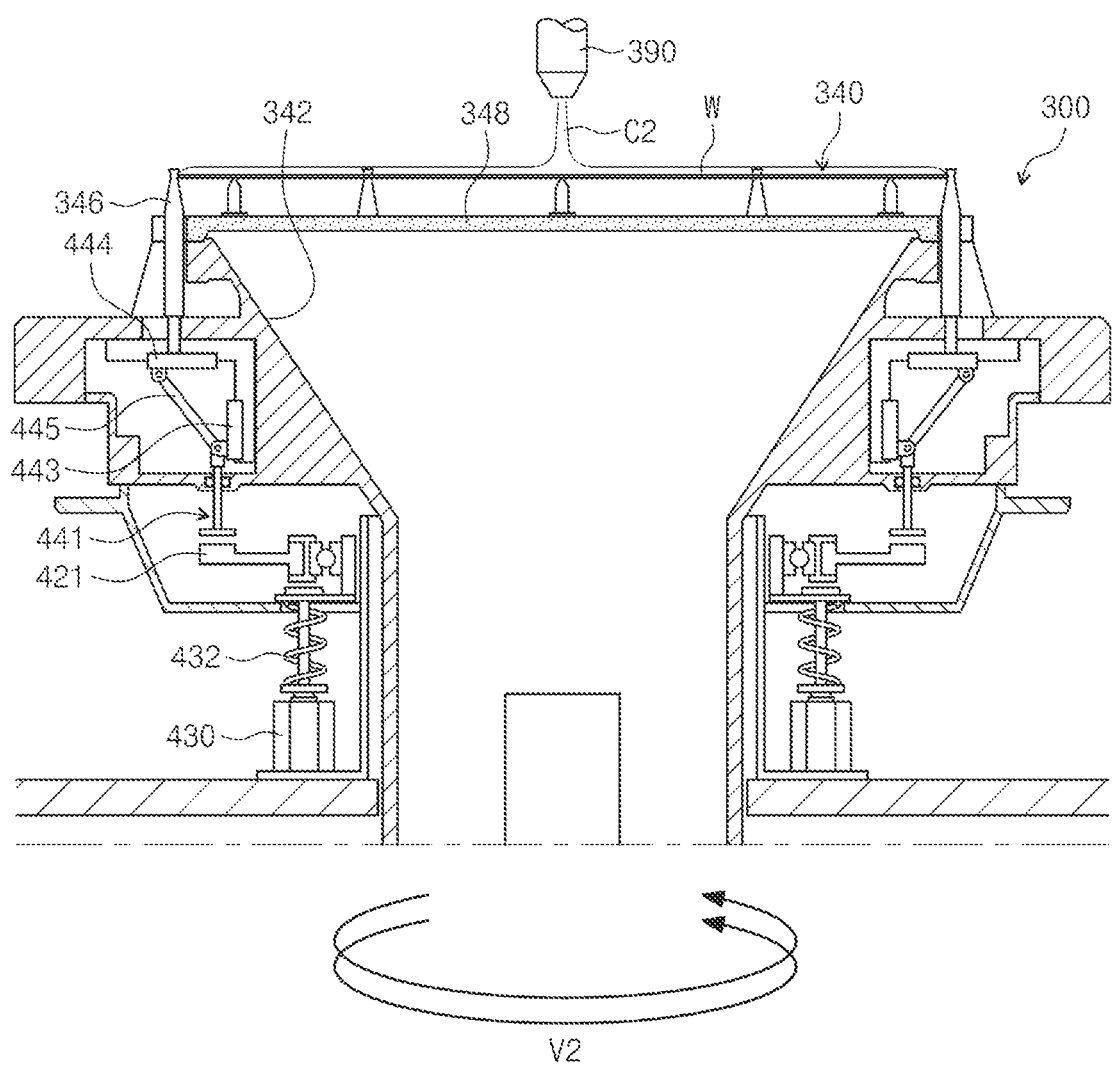

FIG. 14 is a diagram illustrating the second liquid supply operation according to the exemplary embodiment of the present invention. Referring to FIG. 14, after the first liquid film C1 is heated, a second liquid is supplied to the substrate W to form a second liquid film C2. At this time, the spin chuck 346 rotates the substrate W at the second speed v2. In addition, the chuck pin moving unit 400 moves the chuck pin 346 to the contact position in which the chuck pin 346 is in contact with the side portion of the substrate W. The second liquid may be provided in the same liquid as the first liquid. The second liquid may be provided as an aqueous solution of phosphoric acid. The thickness of the second liquid film C2 may be thinner than the thickness of the first liquid film C1. The second speed v2 may be faster than the first speed v1. For example, the rotation at the first speed v1 may be a low-speed rotation, and the rotation at the second speed v2 may be a high-speed rotation. For example, the first speed v1 may be 20 RPM or less.

The substrate treatment according to FIGS. 12 to 14 may be repeatedly performed a plurality of times. When the substrate treatment according to FIGS. 11 to 14 is finished, rinse processing (rinse process) of supplying a rinse liquid to the substrate W to remove by-products generated by reaction with the processing liquid from the surface of the substrate W is performed. The rinse solution may be pure water (DIW).

According to the substrate treating method according to the exemplary embodiment of the present invention, in the first liquid supply operation and the liquid film heating operation, the chuck pin 346 is moved so that the chuck pin 346 is located at the open position, and in the second liquid supply operation, the chuck pin 346 is moved so that the chuck pin 346 is located at the contact position. At this time, according to the general spin chuck structure of moving the chuck pin between the open position and the contact position by using a rotary cylinder that can rotate 90 degrees, the chuck pin is movable only when the spin chuck is stopped. Therefore, when the spin chuck has to be stopped and the chuck pin has to be moved whenever each operation of the substrate treating method is performed, the process takes a long time and the process efficiency is degraded, and when the spin chuck is stopped for the stop of the spin chuck and the movement of the chuck pin at each process operation, a liquid film having a uniform thickness may not be obtained, or the liquid film may be excessively hardened, causing the liquid film to break. In addition, when the treatment the substrate progresses in a state in which the chuck pin is in contact with the side portion of the substrate without stopping the spin chuck at each operation of the substrate treating method in the spin chuck structure in the related art, as described above, there are problems in that the liquid film flows along the surface of the chuck pin and thus a certain amount of liquid film cannot be formed, and since the surface tension of the liquid film is reduced by the contact area between the chuck pin and the side portion of the substrate, it is difficult to form a liquid film of a certain thickness.

However, according to the exemplary embodiment of the present invention, by providing the structure in which the chuck pin 346 of the rotating spin chuck 342 can be opened and closed at all times by using the clutch module, which is a mechanical device, it is possible to move the chuck pin 346 even while the spin chuck 342 is being rotated, thereby solving the aforementioned problems.

Meanwhile, the substrate treating apparatus and the substrate treating method according to the above-described exemplary embodiments may be controlled and performed by a controller (not illustrated). Configuration, storage and management of the controller may be realized in the form of hardware, software, or a combination of hardware and software. The file data and/or the software configuring the controller may be stored in volatile or non-volatile storage devices, such as Read Only Memory (ROM); or memory, such as, for example, Random Access Memory (RAM), memory chips, devices, or integrated circuits, or a storage medium, such as Compact Disk (CD), Digital Versatile Disc (DVD), magnetic disk, or magnetic tape, which are optically or magnetically recordable and simultaneously machine (for example, computer)-readable.

The foregoing detailed description illustrates the present invention. In addition, the foregoing is intended to describe exemplary or various exemplary embodiments for implementing the technical spirit of the present invention, and the present invention may be used in various other combinations, changes, and environments. That is, the foregoing content may be modified or corrected within the scope of the concept of the invention disclosed in the present specification, the scope equivalent to that of the disclosure, and/or the scope of the skill or knowledge in the art. Accordingly, the detailed description of the invention above is not intended to limit the invention to the disclosed exemplary embodiment. In addition, the appended claims should be construed to include other exemplary embodiments as well. Such modified exemplary embodiments should not be separately understood from the technical spirit or prospects of the present invention.

What is claimed is:

1. An apparatus for treating a substrate, the apparatus comprising:
   a processing vessel having a processing space;
   a support unit for supporting the substrate in the processing space and rotating the substrate;
   a liquid supply unit for supplying a processing liquid to the substrate supported by the support unit; and
   a heating unit for heating the substrate,
   wherein the support unit includes:
   a spin chuck;
   a rotation driver for rotating the spin chuck;
   a chuck pin installed on the spin chuck so as to be rotated together with the spin chuck; and
   a chuck pin moving unit comprising at least one clutch module, wherein the chuck pin moving unit is configured for moving the chuck pin between a contact position at which the chuck pin is in contact with a side portion of the substrate and an open position at which the chuck pin is spaced apart from the side portion of the substrate, and wherein the chuck pin moving unit moves the chuck pin while the substrate is being rotated by the spin chuck, and the at least one clutch module is rotated together with the spin chuck.

2. The apparatus of claim 1, wherein the chuck pin moving unit includes:
a first clutch module including a first clutch provided to be movable in a vertical direction by a lifting driver; and
a second clutch module including a second clutch facing the first clutch and coupled to the chuck pin.

3. The apparatus of claim 2, wherein when the first clutch is in contact with the second clutch, the chuck pin is moved from the contact position to the open position.

4. The apparatus of claim 2, wherein when the first clutch is spaced apart from the second clutch, the chuck pin is located at the contact position.

5. The apparatus of claim 2, wherein when the first clutch comes into contact with the second clutch, the first clutch is rotated together with the second clutch.

6. The apparatus of claim 2, wherein the first clutch module includes:
the first clutch;
a fixing member which is not rotated together with the spin chuck; and
a bearing member disposed between the first clutch and the fixing member.

7. The apparatus of claim 6, wherein the bearing member includes an outer ring coupled to the fixing member, an inner ring coupled to the first clutch, and a ball disposed between the outer ring and the inner ring, and
when the first clutch is in contact with the second clutch, the first clutch is rotated together with the second clutch with respect to the fixing member.

8. The apparatus of claim 6, wherein an elastic member is provided between the lifting driver and the first clutch.

9. The apparatus of claim 5, wherein an impact mitigating member is disposed inside the first clutch, and
the impact mitigating member mitigates an impact generated in a rotational direction of the first clutch when the first clutch is in contact with the second clutch and is rotated together with the second clutch.

10. The apparatus of claim 2, wherein the second clutch module includes:
the second clutch;
a base member including a first portion having a longitudinal direction corresponding to the vertical direction, and a second portion extending from the first portion and extending in a direction perpendicular to the longitudinal direction of the first portion;
a first moving member movably coupled to the first portion of the base member;
a second moving member coupled to the chuck pin and movably coupled to the second portion of the base member; and
a third moving member having one end hinged to the first moving member and the other end hinged to the second moving member, and
the second clutch is coupled to the first moving member.

11. The apparatus of claim 10, wherein the second clutch includes:
a plate portion facing the first clutch; and
a pillar portion for connecting the plate and the first moving member.

12. The apparatus of claim 11, wherein a partition wall is disposed between the first clutch module and the second clutch module, and
the second clutch is located between the partition wall and the first clutch.

13. The apparatus of claim 12, wherein a hole through which the pillar portion of the second clutch passes is formed in the partition wall, and
a sealing member is provided between an inner surface of the hole of the partition wall and the pillar portion of the second clutch.

14. The apparatus of claim 3, wherein the spin chuck is rotated such that the substrate is rotated at a first speed or a second speed faster than the first speed,
when the substrate is rotated at the first speed, the first clutch is in contact with the second clutch, and
when the substrate is rotated at the second speed, the first clutch is spaced apart from the second clutch.

15. A method of treating a substrate, the method comprising:
supplying a first liquid to a substrate rotating at a first speed in an open state in which a chuck pin provided for supporting a side portion of the substrate is located at an open position at which the chuck pin is spaced apart from the side portion of the substrate and forming a first liquid film on the substrate;
heating the first liquid film formed on the substrate in the open state, after the supplying; and
supplying a second liquid to the substrate rotating at a second speed faster than the first speed in a contact state in which the chuck pin is located at a contact position at which the chuck pin is in contact with the side portion of the substrate to support the side portion of the substrate, after the heating,
wherein the change from the open state to the contact state is performed while the substrate is being rotated.

16. The method of claim 15, wherein the first liquid and the second liquid are the same, and
the first liquid is an aqueous solution of phosphoric acid.

17. The method of claim 15, wherein the amount of second liquid supplied per unit time in the second supplying is greater than the amount of first liquid supplied per unit time in the first supplying.

18. The method of claim 15, wherein in the heating, the substrate is rotated at the first speed, and the first liquid is not supplied onto the substrate.

19. A method of treating a substrate by using the apparatus of treating the substrate of claim 1, the method comprising:
supplying a first liquid to a substrate rotating at a first speed in an open state in which the chuck pin is located at the open position and forming a first liquid film on the substrate;
heating the first liquid film formed on the substrate in the open state in which the chuck pin is located at the open position, after the supplying; and
supplying a second liquid to the substrate rotating at a second speed faster than the first speed in a contact state in which the chuck pin is located at the contact position, after the heating,
wherein the change of the chuck pin from the open state to the contact state is performed while the substrate is being rotated.

* * * * *